US012015010B2

(12) United States Patent
Chang et al.

(10) Patent No.: US 12,015,010 B2
(45) Date of Patent: Jun. 18, 2024

(54) VERTICALLY STACKED SEMICONDUCTOR DEVICE INCLUDING A HYBRID BOND CONTACT JUNCTION CIRCUIT AND METHODS OF FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 314 days.

(21) Appl. No.: 17/477,643

(22) Filed: Sep. 17, 2021

(65) Prior Publication Data

US 2022/0320047 A1  Oct. 6, 2022

Related U.S. Application Data

(60) Provisional application No. 63/168,366, filed on Mar. 31, 2021.

(51) Int. Cl.
*H01L 25/065* (2023.01)
*H01L 23/00* (2006.01)
*H01L 23/482* (2006.01)

(52) U.S. Cl.
CPC ........ *H01L 25/0657* (2013.01); *H01L 23/482* (2013.01); *H01L 24/08* (2013.01); *H01L 2224/08146* (2013.01); *H01L 2224/80895* (2013.01); *H01L 2224/80896* (2013.01)

(58) Field of Classification Search
CPC .......... H01L 24/08; H01L 2224/08146; H01L 24/02; H01L 24/05; H01L 2224/0235; H01L 2224/02372; H01L 2224/05548; H01L 25/0657; H01L 24/95; H01L 2224/02375; H01L 2224/02381; H01L 2224/08145
See application file for complete search history.

(56) References Cited

U.S. PATENT DOCUMENTS

| 2017/0069593 | A1* | 3/2017 | Chou | H01L 23/498 |
| 2017/0287878 | A1* | 10/2017 | Huang | H01L 25/50 |
| 2018/0040587 | A1* | 2/2018 | Tao | H01L 24/32 |
| 2019/0013265 | A1* | 1/2019 | Carney | H01L 22/12 |
| 2020/0020635 | A1* | 1/2020 | Chang | H01L 23/53257 |
| 2020/0058617 | A1* | 2/2020 | Wu | H01L 25/50 |
| 2020/0203329 | A1* | 6/2020 | Kanamori | H01L 24/09 |
| 2021/0225737 | A1* | 7/2021 | Fang | H01L 24/05 |
| 2021/0343669 | A1* | 11/2021 | Jung | H01L 25/18 |
| 2021/0364710 | A1* | 11/2021 | Chen | H01L 23/49816 |
| 2021/0375848 | A1* | 12/2021 | Zhou | H01L 24/09 |

(Continued)

FOREIGN PATENT DOCUMENTS

JP        2002076244 A  *  3/2002

*Primary Examiner* — Mamadou L Diallo
(74) *Attorney, Agent, or Firm* — The Marbury Law Group, PLLC

(57) ABSTRACT

A semiconductor device includes a first semiconductor die, a second semiconductor die including a side surface bonded to the first semiconductor die, such that the second semiconductor die is perpendicular to the first semiconductor die, and a junction circuit for connecting the first semiconductor die to the second semiconductor die.

20 Claims, 24 Drawing Sheets

(56) References Cited

U.S. PATENT DOCUMENTS

| | | | |
|---|---|---|---|
| 2022/0068745 A1* | 3/2022 | Li | H01L 27/0688 |
| 2022/0077105 A1* | 3/2022 | He | H01L 24/80 |
| 2022/0139855 A1* | 5/2022 | Hwang | H01L 24/80 |
| | | | 257/314 |
| 2022/0199559 A1* | 6/2022 | Fang | H01L 24/09 |
| 2022/0328441 A1* | 10/2022 | Chen | H10B 43/40 |
| 2022/0344291 A1* | 10/2022 | Liu | H01L 24/05 |
| 2022/0344301 A1* | 10/2022 | Yu | H01L 24/80 |
| 2022/0367391 A1* | 11/2022 | Wei | H01L 25/50 |
| 2022/0406754 A1* | 12/2022 | Sharma | H01L 25/0657 |
| 2023/0170243 A1* | 6/2023 | Or-Bach | H01L 29/792 |
| | | | 438/129 |

* cited by examiner

VERTICALLY STACKED SEMICONDUCTOR DEVICE INCLUDING A HYBRID BOND CONTACT JUNCTION CIRCUIT AND METHODS OF FORMING THE SAME

RELATED APPLICATIONS

This application claims the benefit of priority from U.S. Provisional Application No. 63/168,366, entitled "Vertical SoIC by hybrid bond contact circuit design," filed on Mar. 31, 2021, the entire contents of which are incorporated herein by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller semiconductor packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices.

Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
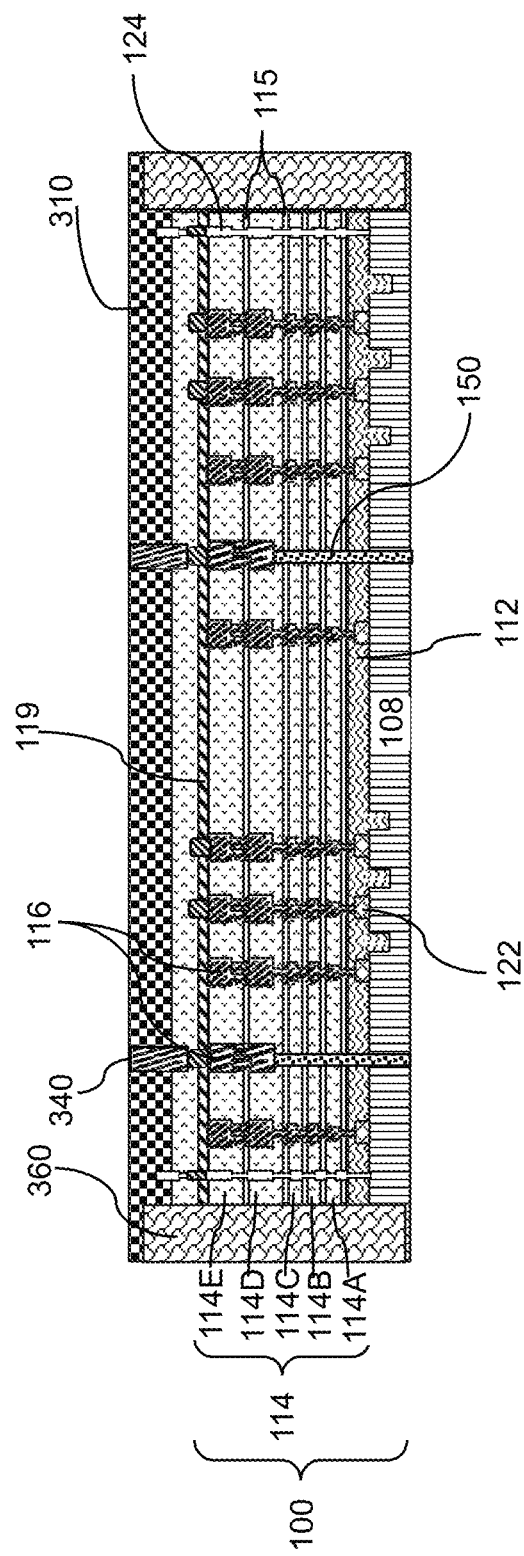
FIG. 1 is a vertical cross-sectional view of a semiconductor die, according to various embodiments of the present disclosure.

The following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor die may contain one or more integrated circuits such as relating to at least one of memory, processor(s), or other semiconductor component(s). A plurality of such dies may be formed on a wafer and then diced out (i.e., singulated) and removed from the wafer. According to one or more embodiments, the wafer, and thus one or more of the semiconductor dies removed therefrom, may include at least one of silicon, germanium, silicon on insulator (SOI), or one or more epitaxial layers.

The semiconductor dies may be cut from the wafer by a saw, such as a diamond saw. A die attach film (DAF) may serve to maintain a relative position between the semiconductor dies during the dicing and removal process. The saw cuts along scribe lines on the wafer to remove the semiconductor dies from the wafer and to separate the semiconductor dies from one another.

Known good dies may be placed upon a carrier such as a glass substrate or other material. Semiconductor dies that meet one or more quality metrics, and are therefore referred to as known good dies, are placed on the carrier. By placing known good dies on the carrier, a decrease in yield may be mitigated because semiconductor arrangements that are formed on the known good dies are less likely to perform other than desired due to being formed on defective semiconductor dies.

An amount of space or distance between respective semiconductor dies may be increased when the semiconductor dies are placed on the carrier as compared to when the semiconductor dies are initially formed on the wafer. The additional space between semiconductor dies may be a function of known good dies being placed on the carrier, such that not all semiconductor dies from the wafer may be transferred to the carrier. The additional space between semiconductor dies provides a larger footprint for making electrical connections to the semiconductor dies thereby affording fan-out packaging.

The known good dies may be embedded in a material, such as a molding compound, on the carrier. The molding compound may be formed over and around the semiconductor dies. A top portion of the molding compound may be removed to expose a top surface of the semiconductor dies. Conductive pads, at times referred to as interconnects, may be exposed when the molding compound is removed to expose the top surface of the semiconductor dies. The additional area between the semiconductor dies may allow an increased number of input/output (I/O) signal wires to fan out from interconnects of the semiconductor dies. The increased number of I/O signal wires may afford, among other things, an increased pin count per semiconductor die, thus allowing more electrical connections, functionality, etc. to be realized from each semiconductor die. The additional area between semiconductor dies may allow passive devices, such as inductors and capacitors, to be formed over the molding compound between semiconductor dies, which may result in lower substrate signal loss, where substrate signal loss can occur when passive devices are formed closer to a semiconductor substrate or closer to other components formed on the substrate.

A plurality of the semiconductor dies may be included in a semiconductor device such as a system on integrated chip (SoIC) device, a chip on wafer on substrate (CoWoS) device and a chip on wafer (CoW) device.

Typically, die-to-die (e.g., chip-to chip) stacking technologies (e.g., SoIC, Chip on Wafer on substrate (CoWoS), Integrated Fan Out (InFO), etc.) may stack semiconductor dies horizontally on top of one another. When stacking multiple layers of semiconductor dies, the top and bottom semiconductor dies cannot be directly connected. A through substrate via (TSV) may be used to connect the top semiconductor die and bottom semiconductor die, but this may introduce additional resistance between semiconductor dies. For example, when a semiconductor stack of a plurality of semiconductor dies is formed, a topmost (i.e., non adjacent) semiconductor die may need to route a electronic signal through a series of TSV's formed within a plurality of intervening semiconductor dies to reach a bottom-most semiconductor die. These additional TSVs that are routed through introduce a significant amount of resistance.

In some embodiments of the present invention, semiconductor dies may be vertically stacked to provide a vertical SoIC device having an innovative vertical system of integrated chips (SoIC) interface design for realizing a high-density multi-die connection. The vertical SoIC device may include a junction circuit (e.g., hybrid bond contact circuit, junction circuit wire line, copper wire, etc.) as a hybrid bond for connecting semiconductor dies. Advantages of the vertical SoIC device may include 1) an increase the number of semiconductor dies (e.g., chips) connected together, and 2) a reduction in resistance between semiconductor dies. The junction circuit may allow each of the perpendicularly stacked semiconductor dies a direct connection to a connection die. In addition, the connection die may provide a more direct connection between non-adjacent semiconductor dies in the stack. Thus, the overall resistance may be reduced.

In some embodiments, a semiconductor die group (e.g., top die vertical chipset) including a second semiconductor die may be stacked vertically on a first semiconductor die (e.g., bottom semiconductor die). One or more second semiconductor dies in the semiconductor die group may be directly coupled to the first semiconductor die (e.g., bottom semiconductor die). Thus, the number of stacked semiconductor dies may be increased, while not increasing the resistance between different semiconductor dies.

The second semiconductor die in the semiconductor die group may be vertically connected to the first semiconductor die through a bond (e.g., hybrid bond) at the junction circuit. At the junction circuit, any layer (e.g., metal layer) of the second semiconductor die may be connected to the first semiconductor die. In some embodiments, a bonding layer may be formed on a second interface surface of the second semiconductor die and used to pull out a copper (Cu) wire.

In some embodiments, a bottom interface (e.g., connection) surface of the semiconductor die group may include a single layer of a metal or in some embodiments may be two or more layers of a metal material as a second contact. For example, the common Tungsten (W) contact, Cu (IM/TM), Al (e.g., Al pad), TiN/TaN (e.g., barrier layer) may be used alone or in combination.

In some embodiments, a bonding redistribution layer (e.g., bonding layer metal routing, circuit extension, etc.) may be formed in a metal-free area (e.g., silicon, intermetal dielectric (IMD), etc.), and used as the junction circuit (e.g., hybrid bond junction). The bonding redistribution layer (RDL) may be used to provide an improved bonding area. The bonding RDL may include, for example, a bonding via connected to the second interface surface in the semiconductor die group, a bonding pad (to contact the first semiconductor die), and a bonding trench for connecting the bonding via to the bonding pad.

Referring to the drawings, FIG. 1 illustrates a semiconductor die 100 that may be included in a semiconductor package that includes a multi-die stack according to one or more embodiments of the present disclosure. The semiconductor die 100 may include a semiconductor substrate (e.g., silicon substrate) 108. An interlayer dielectric (ILD) 112 may be formed on the semiconductor substrate 108 and an intermetal dielectric (IMD) 114 may be formed over the ILD 112. The ILD 112 and IMD 114 may include, for example, undoped silicon glass (USG), fluorosilicate glass (FSG), etc. The IMD 114 may include a plurality of IMD layers 114A-114E, which may be separated by various etch stop and seal layers 115. The etch stop and seal layers 115 may include, for example, SiC, SiN, etc. Other suitable etch stop materials may be within the contemplated scope of disclosure.

Metal features 116 may be formed in the IMD 114. The metal features 116 may include, for example, various conductive metal vias that may be formed between and in contact with various conductive metal lines. The metal lines may be formed on different layers of the IMD 114. The metal features 116 may be formed of copper, copper alloys, aluminum, aluminum alloys, or some combination thereof. Other suitable conductive metal materials may be used for the metal features 116 are within the contemplated scope of disclosure. The upper surfaces of the uppermost IMD layer 114E and the metal features 116 may be planarized to be coplanar, and a passivation layer 119 may be formed on the planarized surfaces of the uppermost IMD layer 114E and the metal features 116. The passivation layer 119 may include, for example, silicon oxide (e.g., $Si_xO_y$), silicon nitride ($Si_xN_y$), benzocyclobutene (BCB) polymer, polyimide (PI), polybenzoxazole (PBO) or a combination thereof, and may be formed by a suitable process such as spin coating, CVD or the like.

One or more gate electrodes 122 of one or more semiconductor transistor devices may be formed on the semiconductor substrate 108. The metal features 116 may be electrically connected to the gate electrodes 122. One or more seal rings 124 may also be formed in the IMD 114. The seal rings 124 may be formed so as to encircle a functional circuit region of the semiconductor die 100. The seal rings 124 may be electrically isolated from the metal features 116 and may provide protection for the features of semiconductor die 100 from water, chemicals, residue, and/or contaminants that may be present during the processing of the semiconductor die 100. The seal rings 124 may be formed of a conductive material (e.g., metal material) and more particularly, may be formed of the same material, at the same time, and by the same process as the metal features 116. In other embodiments, the seal rings 124 may be formed of a conductive material that is different than the materials forming the metal features 116.

The semiconductor die 100 may also include one or more conductive through-substrate vias (TSV) 150 that may be connected to one or more of the metal features 116. The conductive TSV 150 may extend from the metal feature 116 through the IMD 114, ILD 112, and semiconductor substrate 108. The conductive TSV 150 may include, for example, copper, gold, silver, aluminum or an alloy of two or more of these metals, such as an aluminum copper (AlCu) alloy. Other conductive metal materials for use as the TSV 150 may be within the contemplated scope of disclosure.

The semiconductor die 100 may be attached, for example, to a substrate (not shown). The substrate may include a semiconductor wafer or a carrier substrate and may include, for example, silicon-based materials such as glass or silicon oxide, aluminum oxide, ceramic materials, or combinations thereof. The substrate may include a planar top surface on which the semiconductor substrate 108 of the semiconductor die 100 can be attached.

A dielectric encapsulation layer 360 may be formed on the semiconductor die 100 so as to encapsulate at least a portion of the semiconductor die 100. The dielectric encapsulation layer 360 may include, for example, silicon dioxide. Alternatively, the dielectric encapsulation layer 360 may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). Other dielectric materials for use as the dielectric encapsulation layer are within the contemplated scope of disclosure.

The semiconductor die 100 may be included, for example, as a part of a semiconductor die stack. For example, a bonding layer (e.g., bonding structure) 310 may be formed on the semiconductor die 100 and used to bond the semiconductor die 100 to another semiconductor die in the semiconductor die stack. The material and formation method of the bonding layer 310 may be similar to those of the ILD 112. A conductive via 340 may be formed in the bonding layer 310 and contact (e.g., directly or indirectly) a metal feature 116 in the semiconductor die 100. The conductive via 340 may be formed of the same material as the metal features 116 and/or the conductive TSV 150. In other embodiments, the conductive via 340 may be formed of a different conductive material than the metal features 116 and/or TSV 150.

Figure 2:
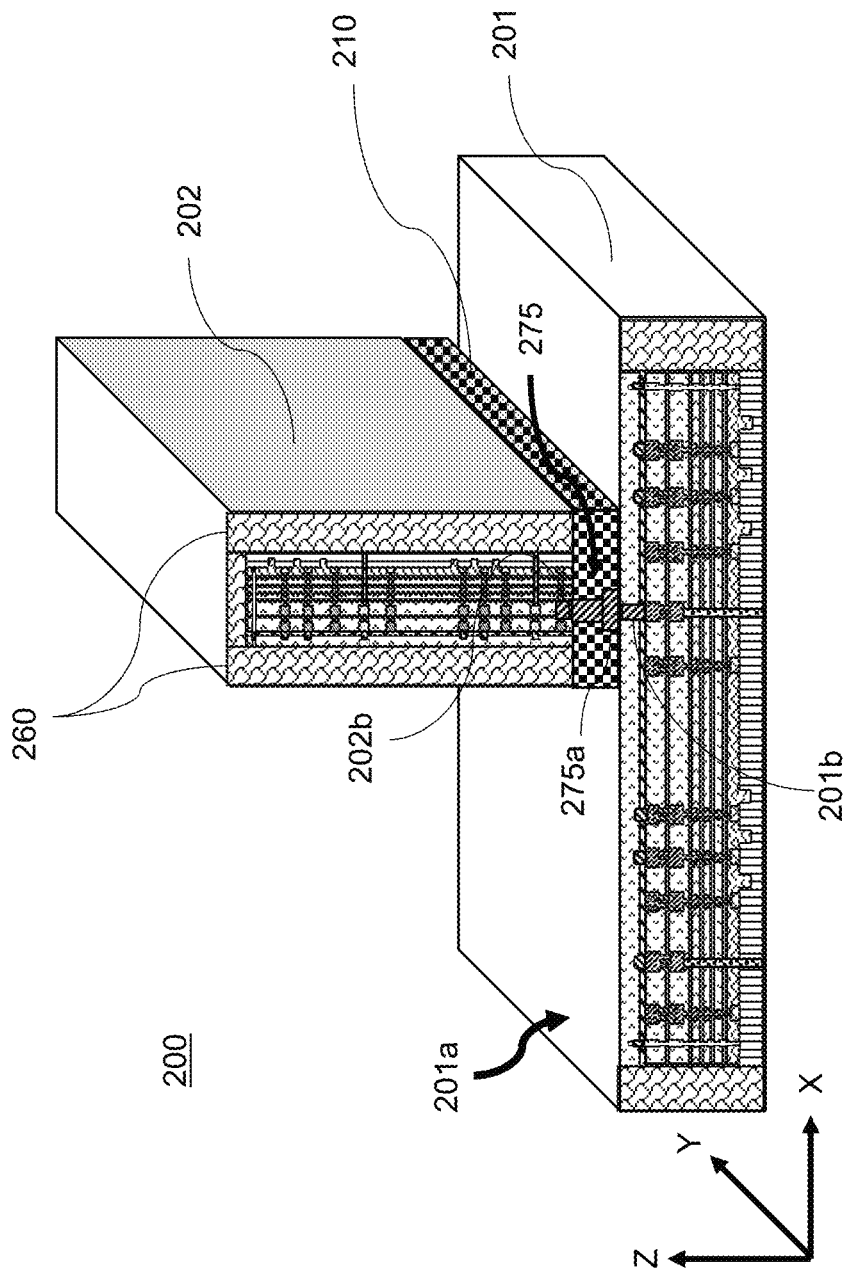
FIG. 2 is a perspective view of a semiconductor package, according to various embodiments of the present disclosure.

FIG. 2 illustrates perspective view of a semiconductor device 200, according to various embodiments of the present disclosure. The semiconductor device 200 may include a vertical SoIC that uses a junction circuit (e.g., hybrid bond contact circuit) to connect a second semiconductor die (e.g., top semiconductor die) to a first semiconductor die (e.g., bottom semiconductor die).

In particular, the semiconductor device 200 may include a first semiconductor die 201 (e.g., bottom semiconductor die) and a second semiconductor die 202 (e.g., top semiconductor die). A side surface of the second semiconductor die 202 may be bonded to the first semiconductor die 201, such that the second semiconductor die 202 is perpendicular to the first semiconductor die 201. The term "perpendicular" may be construed to mean "perpendicular in layered direction". That is, a layered direction (e.g., the direction in which layers are formed) of the second semiconductor die 202 (e.g., the X direction in FIG. 2) may be perpendicular to a layered direction of the first semiconductor die 201 (e.g., the Z direction in FIG. 2).

Each of the first semiconductor die 201 and second semiconductor die 202 may have a structure which is similar to the structure of the semiconductor die 100 in FIG. 1. Thus, for example, each of the first semiconductor die 201 and second semiconductor die 202 may include metal features 116, seal rings 124, a dielectric encapsulation layer 360, etc. A dielectric encapsulation layer 260 may also be formed on the second semiconductor die 202 so as to encapsulate the second semiconductor die 202. The dielectric encapsulation layer 260 may be similar to the dielectric encapsulation layer 360 in FIG. 1.

The semiconductor device 200 may also include a junction circuit 275 for connecting the first semiconductor die 201 and the second semiconductor die 202. The first semiconductor die 201 may include a first interface surface 201a including a first contact 201b, and the second semiconductor die 202 may include a second interface surface 202a (see FIG. 3B) formed in the side surface of the second semiconductor die 202 and including a second contact 202b. The junction circuit 275 may include a metal layer connecting the first contact 201b to the second contact 202b. Each of the first contact 201b and the second contact 202b may include, for example, one or more of a metal contact, a metal bonding pad, a metal trench, a metal barrier layer and a metal via. Further, each of the first contact 201b and the second contact 202b may be formed of copper, copper alloys, aluminum, aluminum alloys, or some combination thereof. The use of other suitable conductive metal materials for the first contact 201b and the second contact 202b is within the contemplated scope of disclosure.

The semiconductor device 200 may also include a bonding layer 210 for bonding the second semiconductor die 202 to the first semiconductor die 201. The junction circuit 275 may be formed in the bonding layer 210. The junction circuit 275 may include, for example, a bonding redistribution layer (RDL) circuit that is formed in the bonding layer 210. The junction circuit 275 may include a bonding pad 275a that contacts the first contact 201b in the first interface surface 201a of the first semiconductor die 201. The junction circuit 275 (e.g., bonding RDL circuit) may be formed of copper, copper alloys, aluminum, aluminum alloys, or some combination thereof. The use of other suitable conductive metal materials for the junction circuit 275 is within the contemplated scope of disclosure.

Figure 3A:
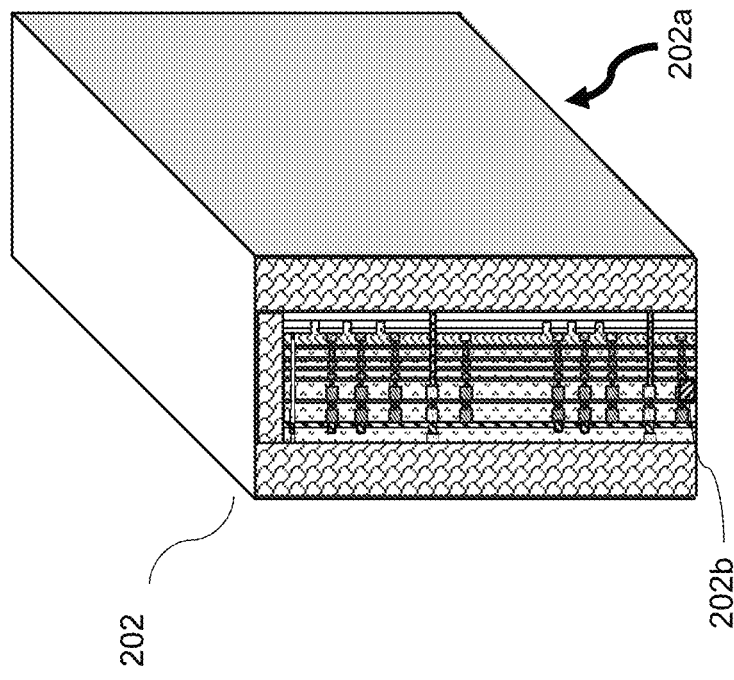
FIGS. 3A-3C illustrate various operations of a method of forming the semiconductor package according to various embodiments of the present disclosure.
Figure 3B:
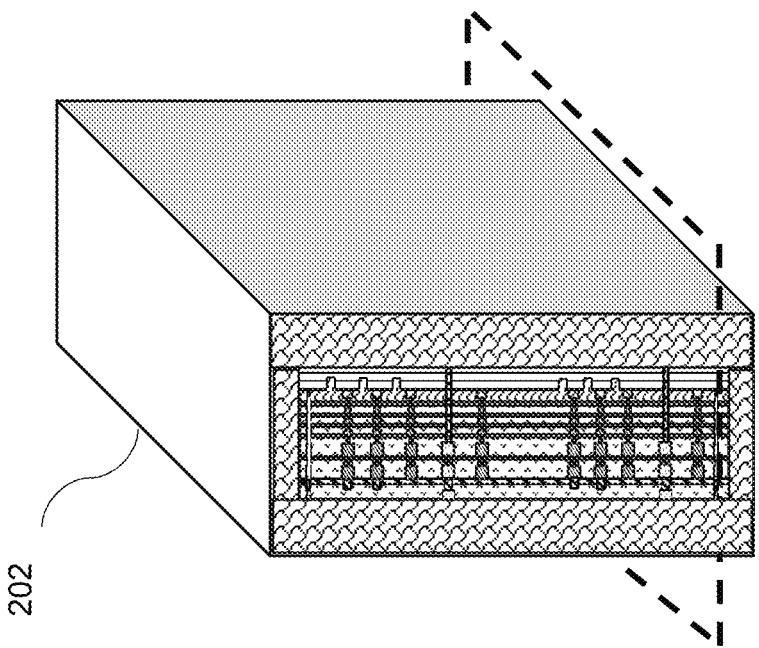
Figure 3C:
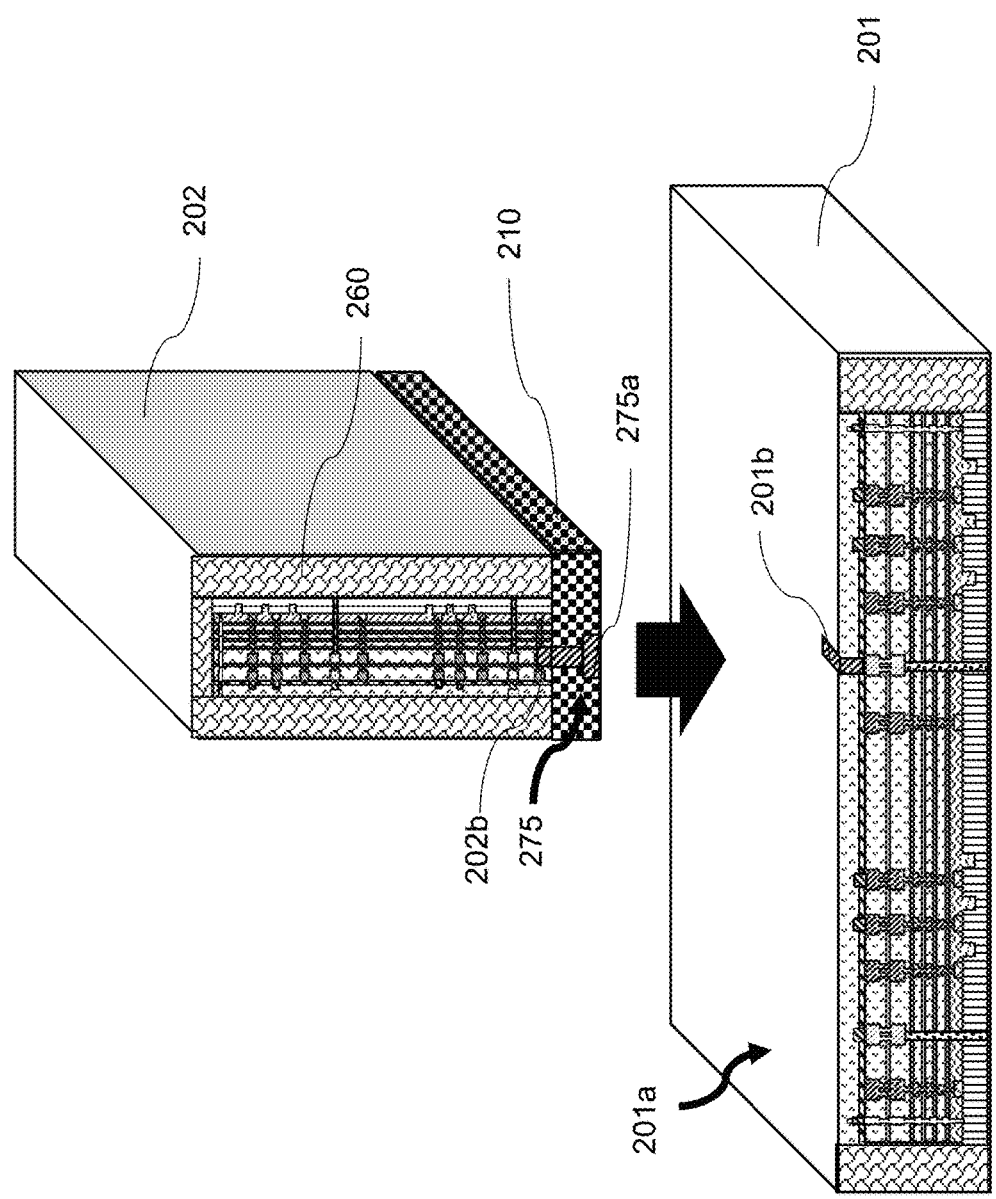

FIGS. 3A-3C illustrate various operations of a method of forming the semiconductor device 200 according to various embodiments of the present disclosure. In FIG. 3A, a second interface surface 202a may be formed in a side surface of the second semiconductor die 202 by planarizing the second semiconductor die 202 along the dashed line in FIG. 3A, such as by chemical mechanical polishing (CMP). It should be noted that there may be other ways to form the second interface surface 202a, such as by cutting or dicing the second semiconductor die 202 along the dashed line in FIG. 3A. The planarizing along the dashed line in FIG. 3A, may result in the removal of at least a portion of the dielectric encapsulation layer 360 and a seal ring 124 (see FIG. 1), and a portion of the dielectric encapsulation layer 260.

As illustrated in FIG. 3B, the formation of the second interface surface 202a (e.g., by planarizing the second semiconductor die 202 in FIG. 3A) may cause a second contact 202b to be formed (e.g., exposed) at the second interface surface 202a. The second contact 202b may include, for example, a metal feature 116 in the second semiconductor die 202 that has been exposed by the planarization process.

As illustrated in FIG. 3C, a bonding layer 210 may be formed on the second interface surface 202a for bonding the second semiconductor die 202 to the first semiconductor die 201. The bonding layer 210 may be similar to the bonding layer 310 described above in FIG. 1.

The junction circuit 275 may be formed in the bonding layer 210. The junction circuit 275 may include, for example, a bonding redistribution layer (RDL) circuit that is formed in the bonding layer 210. The junction circuit 275 (e.g., bonding RDL circuit) may include a bonding pad 275a that contacts the first contact 201b in the first interface surface 201a of the first semiconductor die 201. In particular, the junction circuit 275 may include one or more metal (e.g., copper) wiring layers formed in one or more sublayers of the bonding layer 210.

The method of forming the junction circuit 275 in the bonding layer 210 may be similar to the method of forming the metal features 116 in the IMD 114 of the semiconductor device 100. For example, in embodiments in which the bonding layer 210 is a multi-layer bonding layer, then a first dielectric layer may be deposited on the second interface surface 202a and a first hole may be etched in the first dielectric layer. A metal fill material may then be deposited on the first dielectric layer to fill the first hole, and then the surface of the metal fill material may be planarized. Then a second dielectric layer may be deposited on the first dielectric layer, and a second hole may be etched in the second dielectric layer so as to contact the metal fill material (e.g., bonding via) formed in the first dielectric layer. A metal fill material may then be deposited on the second dielectric layer, and then the surface of the metal fill material may be planarized. Additional dielectric layers (with metal) may be formed on the second dielectric layer as needed to complete the junction circuit 275.

The bonding layer 210 may include a bonding material deposited on the second interface surface 202a. Suitable bonding materials may include silicon oxide or binding polymers, such as an epoxy, a polyimide (PI), a benzocyclobutene (BCB), and a polybenzoxazole (PBO). Other suitable bonding materials may be within the contemplated scope of disclosure. The junction circuit 275 including the bonding pad 275a may be electrically conductive features formed of the same materials as the metal features 116. For example, the junction circuit 275 may include tungsten (W), copper (Cu), a copper alloy, aluminum (Al), an aluminum alloy, or a combination thereof, or the like. Other suitable conductive metal materials for use as the connection bonding pads are within the contemplated scope of disclosure. The bonding layer 210 and junction circuit 275 may be bonded to the second interface surface 202a by using a hybrid bonding process. As such, the junction circuit 275 may be fused to the second contact 202b (e.g., exposed metal feature 116) in the second interface surface 202a, and the bonding layer 210 may be bonded to the dielectric encapsulation layer 260 and to underlying dielectric layers of the second semiconductor die 202.

As further illustrated in FIG. 3C, the second semiconductor die 202 may be positioned over the first semiconductor die 201 so that the bonding pad 275a may be aligned with the first contact 201b, and then lowered onto the first semiconductor die 201 so that the bonding pad 275a contacts the first contact 201b. The bonding layer 210 may then be heated so as to cause the bonding layer 210 to bond to the first interface surface 201a of the first semiconductor die 201.

Figure 4:
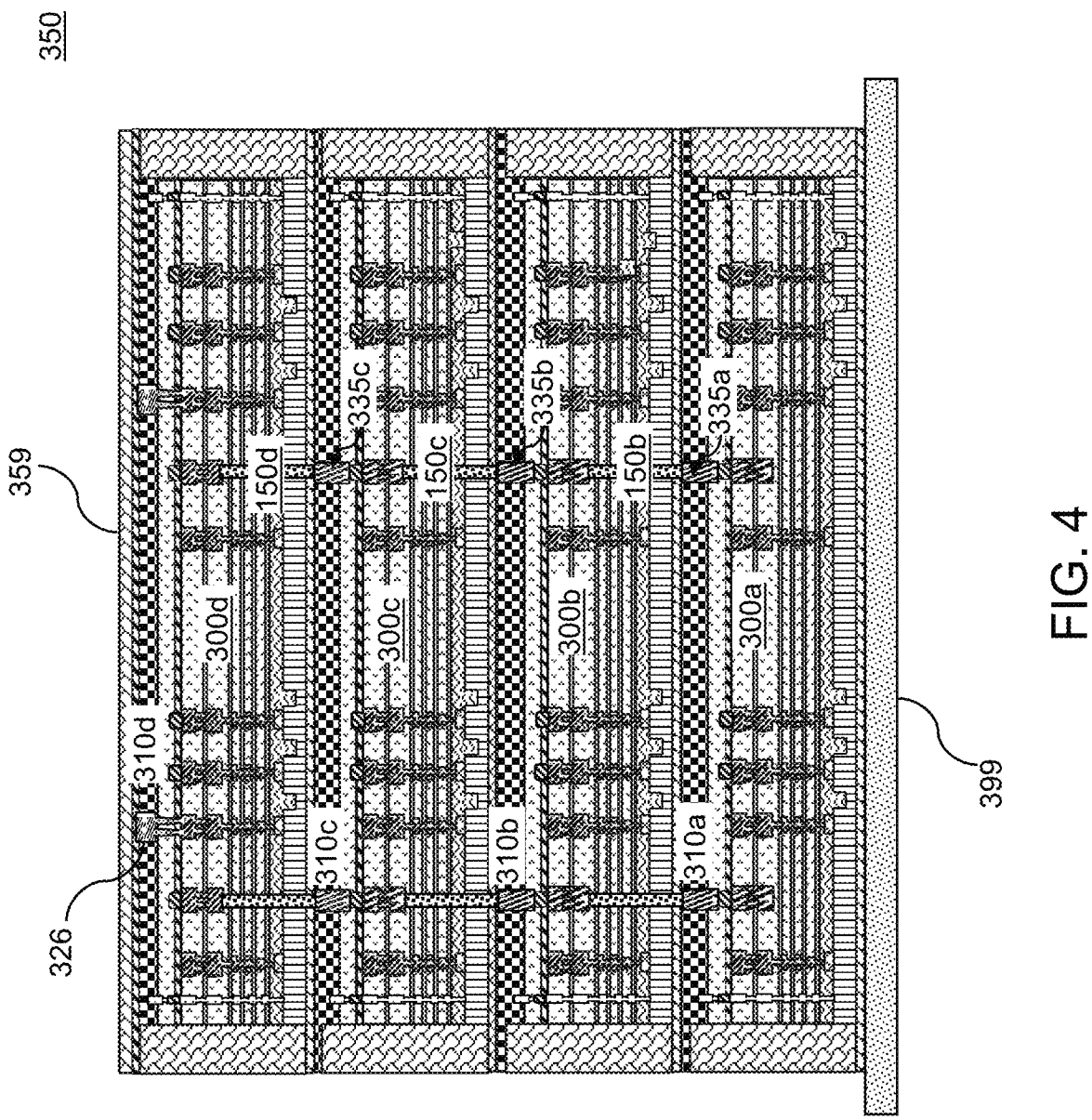
FIG. 4 is a vertical cross-sectional view of a semiconductor die stack group (e.g., vertical semiconductor die stack) according to various embodiments of the present disclosure.

FIG. 4 illustrates a semiconductor die group 350 (e.g., vertical semiconductor die stack) according to various embodiments of the present disclosure. The semiconductor die group 350 may include a plurality of stacked semiconductor dies 300a-300d. The elements of each the semiconductor dies 300a-300d may be similar to the elements of the semiconductor die 100 described above with reference to FIG. 1. In some embodiments, the semiconductor die group 350 may be a vertical SoIC multi-die stack that may include different semiconductor dies having different functions. The stacked semiconductor dies 300a-300d may be, for example, independently selected from an application-specific integrated circuit (ASIC) chip, an analog chip, a sensor chip, a wireless and radio frequency chip, a voltage regulator chip, a memory chip, or the like. The stacked semiconductor dies 300a-300d may be bonded to one another using a hybrid bonding process that may include a dielectric-to-dielectric bonding process, a polymer-to-polymer bonding process, and/or a metal-to-metal bonding process.

The semiconductor die group 350 may be formed, for example, by forming (e.g., mounting) semiconductor die 300a on a carrier 399 (e.g., a silicon wafer, a sapphire wafer, or any other suitable carrier, such as a glass or plastic carrier) (not shown), and then stacking semiconductor die 300b on semiconductor die 300a such that the conductive via 150b in semiconductor die 300b contacts the conductive via 335a in bonding layer 310a. Thus, semiconductor die 300b may be bonded to the bonding layer 310a. The semiconductor die 300c may then be stacked on semiconductor die 300b such that the conductive via 150c in semiconductor die 300c contacts the conductive via 335b in bonding layer 310b, and the semiconductor die 300c may be bonded to the bonding layer 310b. The semiconductor die 300d may then be stacked on semiconductor die 300c such that the conductive via 150d in semiconductor die 300d contacts the conductive via 335c in bonding layer 310c, and the semiconductor die 300d may be bonded to the bonding layer 310c. A protective layer 359 (e.g., a dielectric material, such as silicon oxide, silicon nitride, silicon oxynitride, or the like) may be deposited on semiconductor die 300d. Metal bumps (not shown) may then be connected to the metal pads 326 in the bonding layer 310d.

Other semiconductor die groups in addition to the semiconductor die group 350 may be formed on the carrier. In particular, a plurality of semiconductor die groups 350 may be formed (e.g., simultaneously formed) using the same manufacturing process and, therefore, may include similar components. Alternatively, a plurality of semiconductor die groups may be formed on separate carriers and may include different components.

Figure 5:
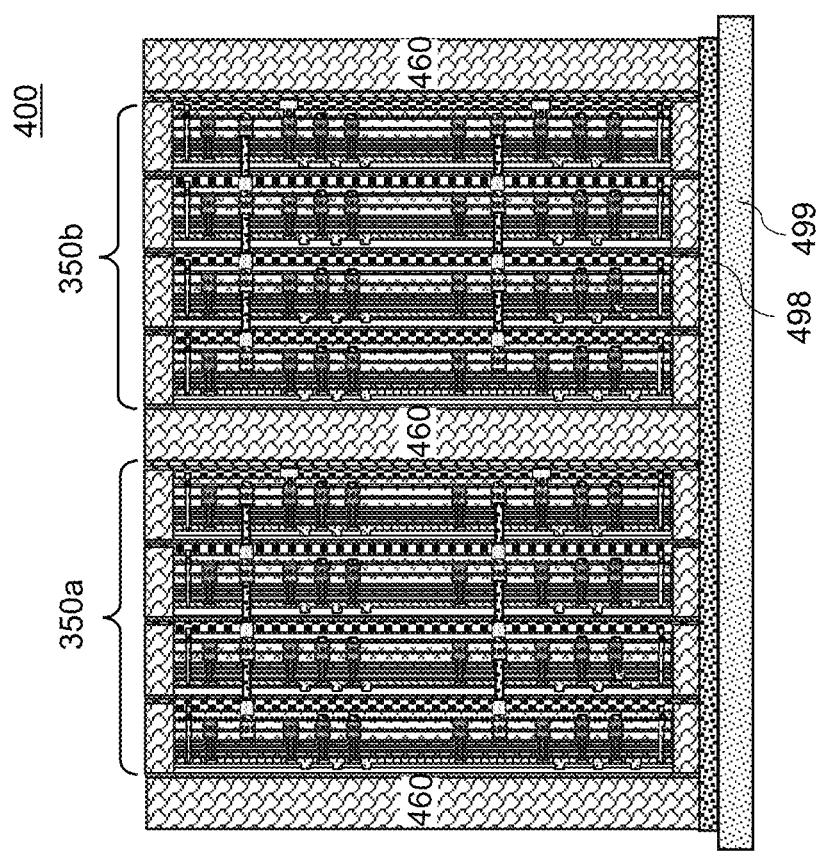
FIG. 5 illustrates a stacked semiconductor die group (e.g., vertical semiconductor die stack) according to various embodiments of the present disclosure.

FIG. 5 illustrates a stacked semiconductor die group 400 (e.g., vertical semiconductor die stack) according to various embodiments. The stacked semiconductor die group 400 may include a plurality of semiconductor die groups 350a, 350b, each of which may be similar in structure and function to the semiconductor die group 350 in FIG. 4.

As illustrated in FIG. 5, the plurality of semiconductor die groups 350a, 350b may be removed from the carrier 399, rotated 90°, and bonded to another carrier 499 by a carrier bonding layer 498. In particular, a side of the plurality of semiconductor die groups 350a, 350b may be bonded to the carrier 499 so that the plurality of semiconductor die groups 350a, 350b may be perpendicularly arranged with the carrier 499. In some embodiments, the carrier bonding layer 498 may be a vertical fusion bump or the like.

The plurality of semiconductor die groups 350a, 350b may then be encapsulated by a dielectric encapsulation layer 460 which may be similar to the dielectric encapsulation layer 360 in FIG. 1. The dielectric encapsulation layer 460 may be deposited using any suitable deposition method and may include any suitable dielectric material, such as silicon oxide, silicon nitride, or the like. Other suitable dielectric materials are within the contemplated scope of disclosure.

Figure 6:
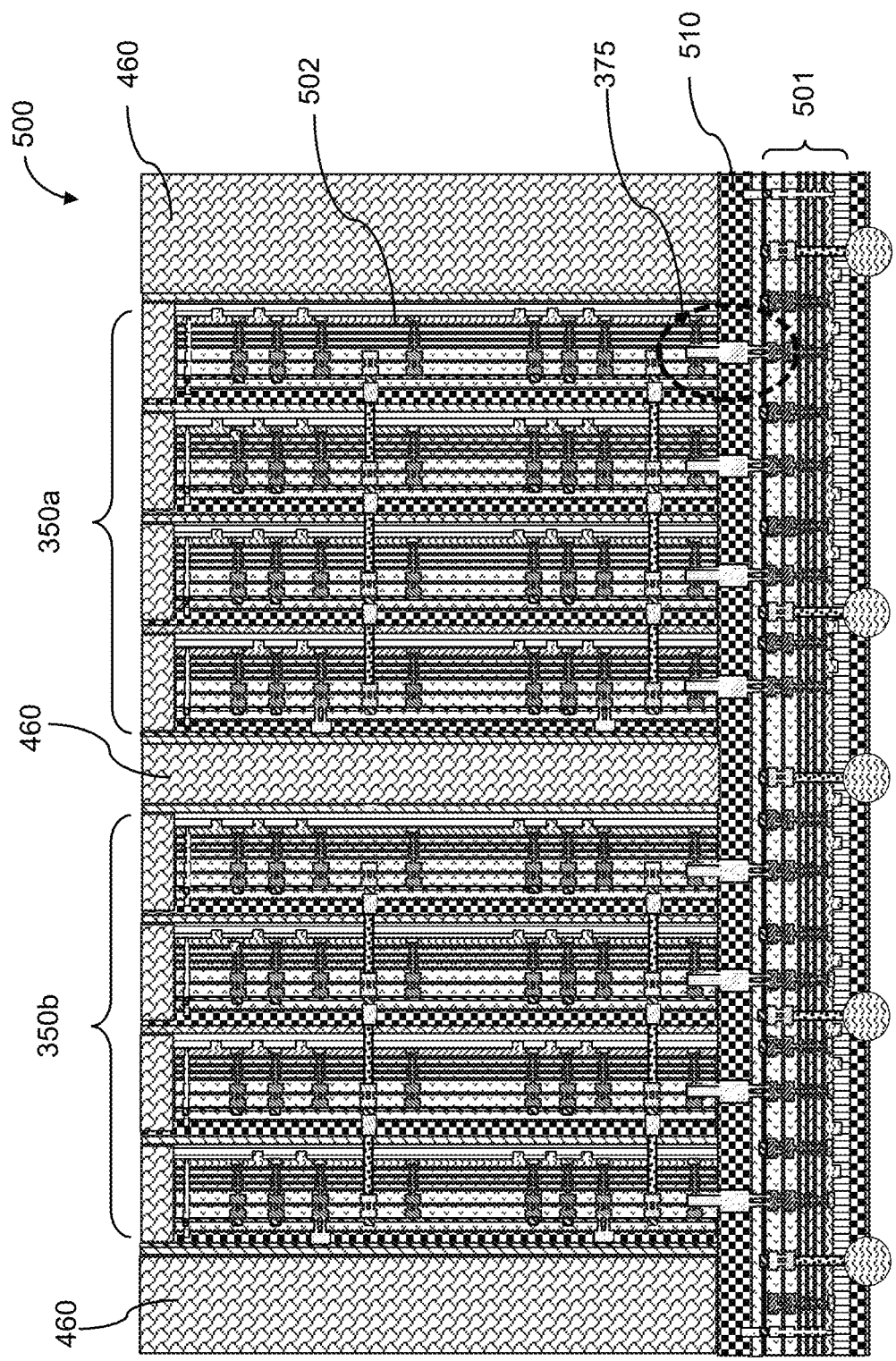
FIG. 6 illustrates a semiconductor device according to various embodiments of the present disclosure.

FIG. 6 illustrates a semiconductor device 500 according to various embodiments. The semiconductor device 500 may include a vertical SoIC multi-die stack that may include different dies having different functions.

The semiconductor device 500 may include the stacked semiconductor die group 400 (after removal of the carrier 499 and carrier bonding layer 498) bonded to a first semiconductor die 501 (e.g., a bottom semiconductor die). In particular, a side surface of the stacked semiconductor die group 400 may be bonded to the first semiconductor die 501 such that the plurality of semiconductor die groups 350a, 350b are perpendicular to the first semiconductor die 501. Each of the plurality of semiconductor die groups 350a, 350b may include a plurality of semiconductor dies. The stacked semiconductor die group 400 may be mounted on the first semiconductor die 501 so that a side surface of the plurality of semiconductor die groups 350a, 350b (e.g., a side surface of the semiconductor dies in the plurality of semiconductor die groups 350a, 350b) is bonded to the first semiconductor die 501.

The semiconductor device 500 may also include a junction circuit 375 for connecting the first semiconductor die 501 to a second semiconductor die 502 in the plurality of semiconductor dies. The first semiconductor die 501 may be similar in structure and function to the semiconductor die 100 described above.

The semiconductor device 500 may also include a bonding layer (e.g., bonding structure) 510 for bonding the stacked semiconductor die group 400 to the first semiconductor die 501. The bonding layer 510 may be formed initially on the side surface of the stacked semiconductor die group 400, and one or more junction circuits 375 (e.g., redistribution layer (RDL) circuits) formed in the bonding layer 510. The junction circuits 375 may electrically connect the first semiconductor die 501 to one or more second semiconductor dies 502 in the stacked semiconductor die group 400. In particular, each of the semiconductor dies in the stacked semiconductor die group 400 may be connected as a second semiconductor die 502 to the first semiconductor die 501 by a dedicated junction circuit 375, as illustrated in FIG. 6.

FIGS. 7A-7D illustrate a method of making the semiconductor device 500 according to various embodiments.

Figure 7A:
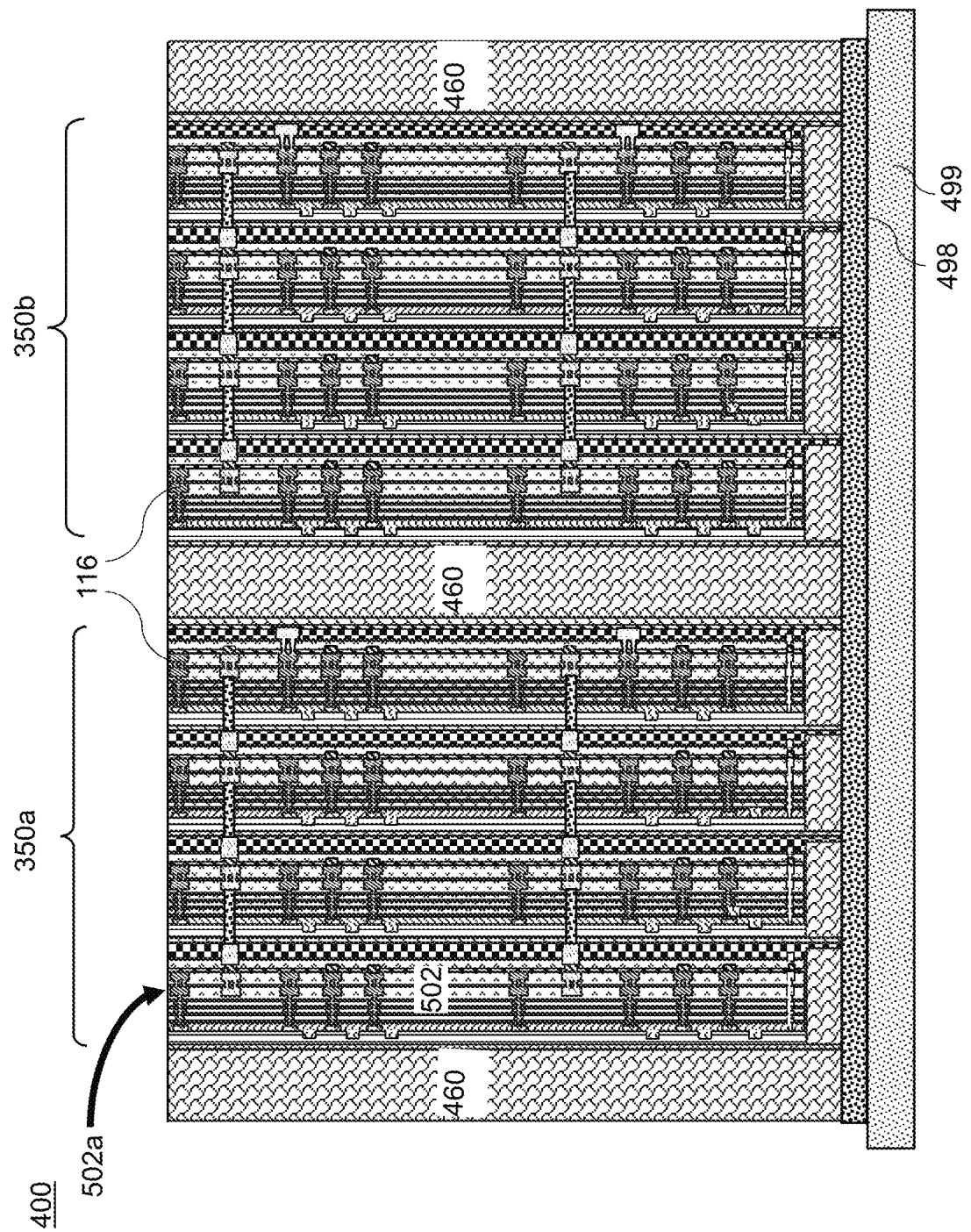
FIGS. 7A-7D illustrate various operations of a method of making the semiconductor device according to various embodiments of the present disclosure.

As illustrated in FIG. 7A, a planarization process, such as chemical mechanical planarization (CMP) may be performed on the stacked semiconductor die group 400 illustrated in FIG. 5. In particular, a planarization may be performed on the plurality of semiconductor die groups 350a, 350b and the dielectric encapsulation layer 460 in the stacked semiconductor die group 400. In the planarization, the plurality of semiconductor die groups 350a, 350b may be polished to remove at least a portion of the dielectric encapsulation layer 360 and a seal ring 124 (see FIG. 1), and a portion of the dielectric encapsulation layer 260. After the planarization, the metal features 116 may be exposed on the surface of the exposed side surface of the plurality of semiconductor die groups 350a, 350b.

Figure 7B:
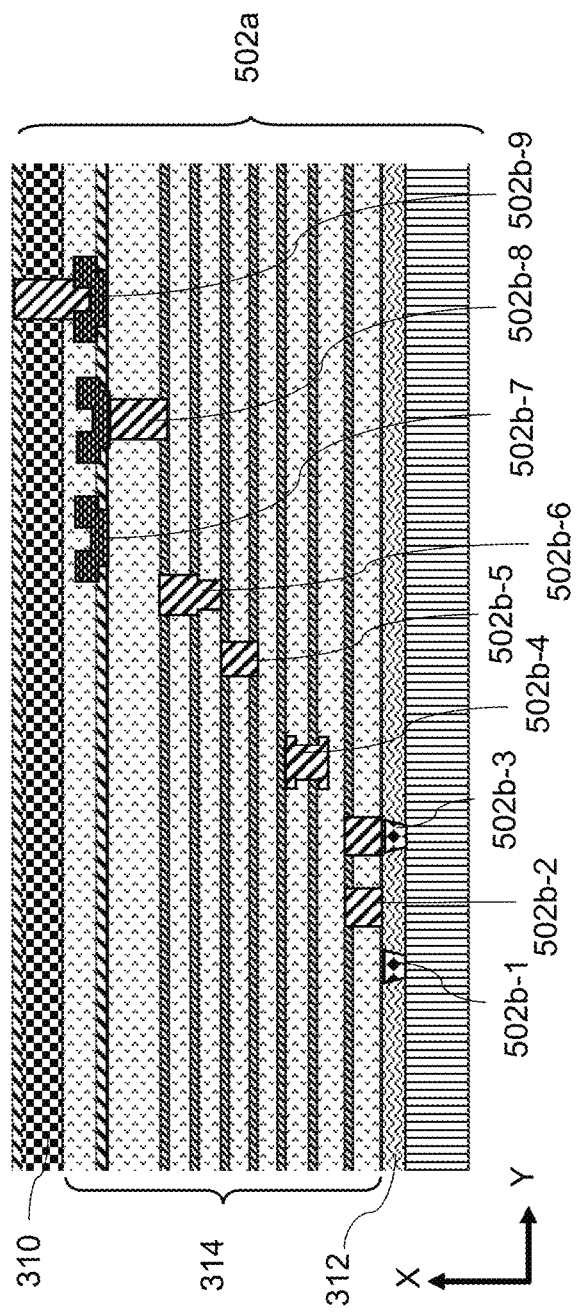

As illustrated in FIG. 7B, a second interface surface 502a of the second semiconductor die 502 may be formed in the side surface of the plurality of semiconductor die groups 350a, 350b that is formed by planarizing the stacked semiconductor die group 400. It should be noted that there may be other ways to form the second interface surface 502a, such as by cutting, dicing, etc.

As illustrated in FIG. 7B, the second interface surface 502a of the second semiconductor die 502 may include an interlayer dielectric 312, an intermetal dielectric 314 and a bonding layer 310. In addition, one or more second contacts 502b may be formed (e.g., exposed) at the second interface surface 502a. The second contacts 502b may include, for example, a tungsten contact 502b-1, a copper trench 502b-2, a combination tungsten contact/copper trench 502b-3, a combination copper trench/via/trench 502b-4, a copper via 502b-5, a combination copper trench/via 502b-6, an aluminum pad 502b-7, a combination aluminum pad/copper trench 502b-8, and a combination bonding metal/aluminum pad 502b-9.

Figure 7C:
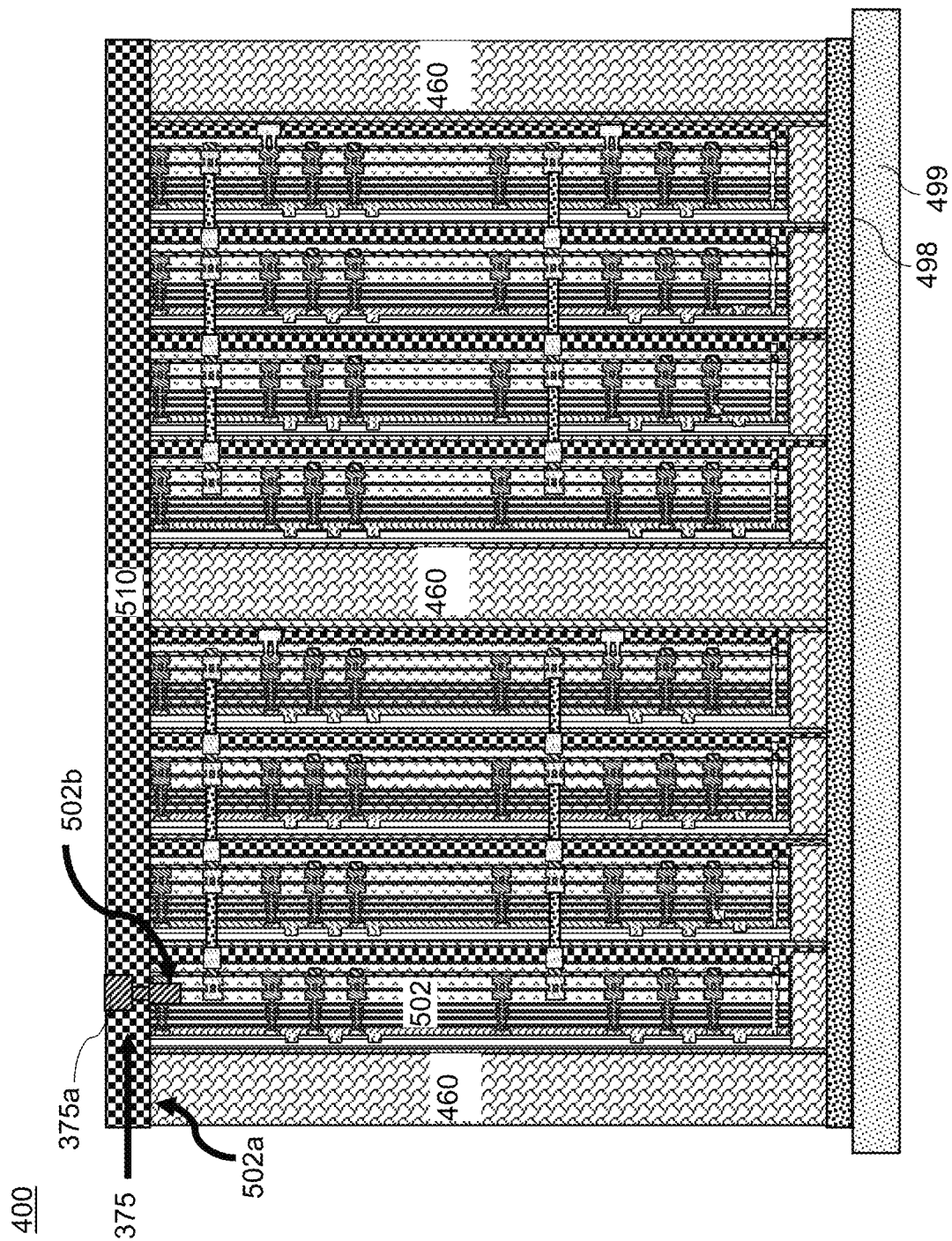

As illustrated in FIG. 7C, a bonding layer 510 may be formed on the planarized side surface of the stacked semiconductor die group 400 that was formed by the planarization process in FIG. 7A. The bonding layer 510 may be similar to the bonding layer 310 described above in FIG. 1. In particular, suitable bonding materials for the bonding layer 510 may include silicon oxide or binding polymers, such as an epoxy, a polyimide (PI), a benzocyclobutene (BCB), and a polybenzoxazole (PBO). Other suitable bonding materials may be within the contemplated scope of disclosure. The bonding layer 510 may be formed in order to bond the plurality of semiconductor die groups 350a, 350b in the stacked semiconductor die group 400 to the first semiconductor die 501.

The bonding layer 510 may have formed therein a junction circuit 375 that may include one or more metal layers for connecting the second contact 502b in the second interface surface 502a of the second semiconductor die 502, to the first contact 501b in the first interface surface 502a of the first semiconductor die 501. The junction circuit 375 may include, for example, a bonding redistribution layer (RDL) circuit that is formed in the bonding layer 510, and the junction circuit 375 (e.g., bonding RDL circuit) may include a bonding pad 375a. The junction circuit 375 may include one or more metal (e.g., copper) wiring layers formed in one or more sublayers of the bonding layer 510. In particular, the wiring layers of the junction circuit may be formed of the same materials as the metal features 116, and may include tungsten (W), copper (Cu), a copper alloy, aluminum (Al), an aluminum alloy, or a combination thereof, or the like.

Figure 7D:
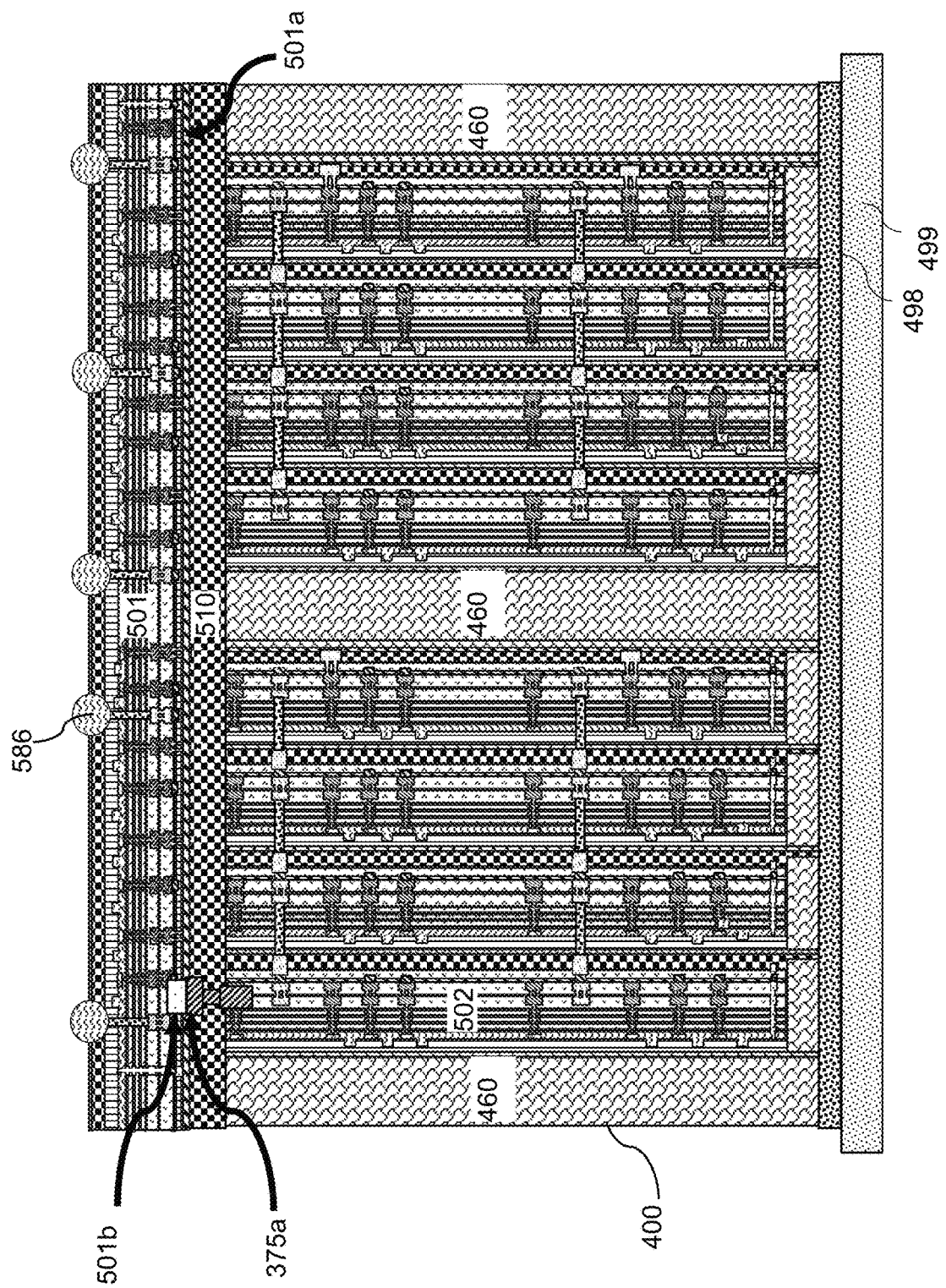

As illustrated in FIG. 7D, the first semiconductor die 501 may be positioned over the stacked semiconductor die group 400 so that the first contact 501b may be aligned with the bonding pad 375a, and may be lowered onto the stacked semiconductor die group 400 so that the first contact 501b contacts the bonding pad 375a. The bonding layer 510 may then be bonded to the first interface surface 501a of the first semiconductor die 501 using any suitable bonding process, such as a hybrid bonding process.

The semiconductor substrate of the first semiconductor die 501 may then be thinned to expose one or more metal features (e.g., via, interconnect, etc.) in the first semiconductor die 501. A dielectric layer and electrical contacts 586 such as solder bumps may be formed on the exposed metal features in the first semiconductor die 501. The carrier 499 may then be removed to form the completed semiconductor device 500 that is illustrated in FIG. 6.

Figure 8:
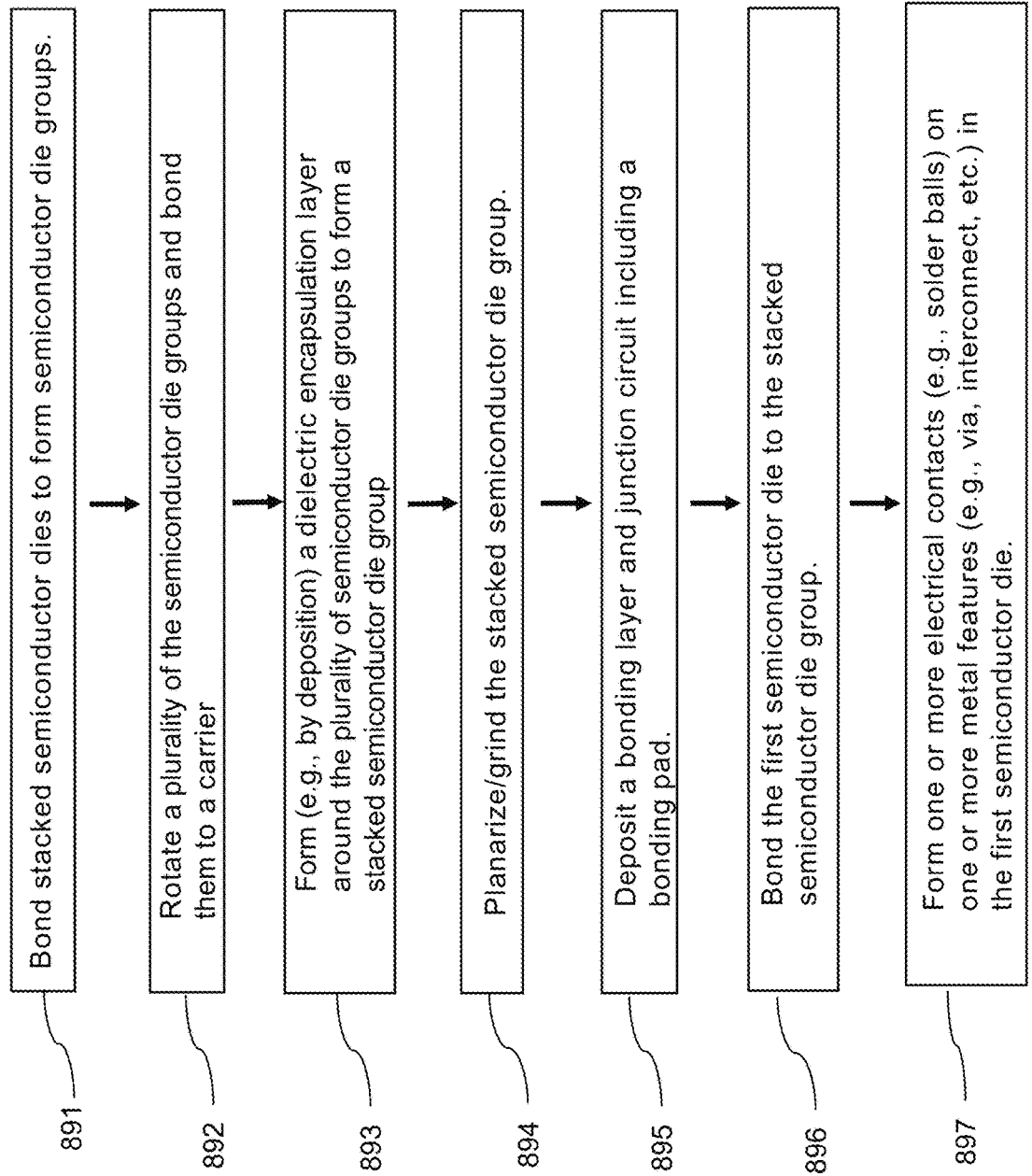
FIG. 8 provides a flowchart illustrating a method of forming a semiconductor device according to various embodiments of the present disclosure.

FIG. 8 provides a flowchart illustrating a method of forming the semiconductor device 500 according to one or more embodiments. The method may include a Step 891 of bonding stacked semiconductor dies to form semiconductor die groups (FIG. 4), a Step 892 of rotating a plurality of the semiconductor die groups and bonding them to a carrier (FIG. 5), a Step 893 of forming (e.g., by deposition) a dielectric encapsulation layer around the plurality of semiconductor die groups to form a stacked semiconductor die group (FIG. 4S), a Step 894 of planarizing/grinding the stacked semiconductor die group (FIG. 7A), a Step 895 of depositing a bonding layer and junction circuit including a bonding pad (FIGS. 7B and 7C), a Step 896 of bonding the first semiconductor die to the stacked semiconductor die group (FIG. 7D), and a Step 897 of forming one or more electrical contacts (e.g., solder balls) on one or more metal features (e.g., via, interconnect, etc.) in the first semiconductor die 501 (FIG. 7D).

Figure 9:
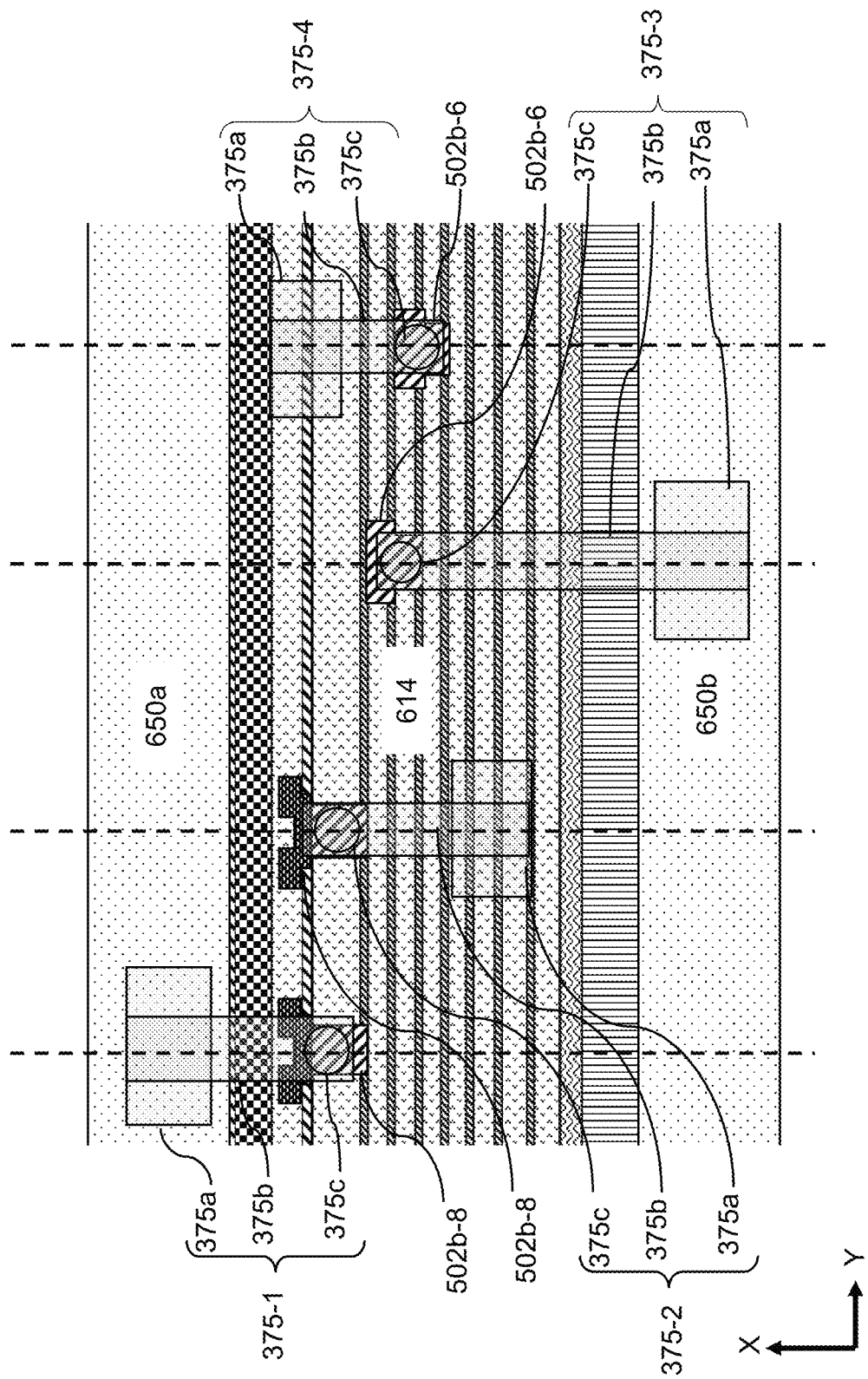
FIG. 9 illustrates a location and configuration of four (4) example junction circuits (e.g., bonding layer metal routing) that may be used according to various embodiments of the present disclosure.

FIG. 9 illustrates a location and configuration of four (4) example junction circuits 375-1 to 375-4 (e.g., bonding layer metal routing) that may be used according to various embodiments. As illustrated in FIG. 9, junction circuit 375-1 may include a bonding via 375c connected to a second contact 502b-8 (e.g., combination aluminum pad/copper trench), a bonding pad 375a formed over a metal-free area 650a (e.g., silicon area) of a second interface surface, and a bonding trench 375b that connects the bonding via 375c to the bonding pad 375a. Junction circuit 375-2 may include a bonding via 375c connected to a second contact 502b-8 (e.g., combination aluminum pad/copper trench), a bonding pad 375a formed over a non-metal area 614 (e.g., intermetal dielectric (IMD)), and a bonding trench 375b that connects the bonding via 375c to the bonding pad 375a. Junction circuit 375-3 may include a bonding via 375c connected to a second contact 502b-6 (e.g., combination copper trench/via), a bonding pad 375a formed over a metal-free area 650b (e.g., silicon area) of a second interface surface, and a bonding trench 375b that connects the bonding via 375c to the bonding pad 375a. Junction circuit 375-4 may include a bonding via 375c connected to a second contact 502b-6 (e.g., combination copper trench/via), a bonding pad 375a formed over a non-metal area 614 (e.g., IMD), and a bonding trench 375b that connects the bonding via 375c to the bonding pad 375a. In each of the junction circuits 375-1, 375-2, 375-3, and 375-4, the bonding trench 375b may extend longitudinally in a first direction (e.g., x-direction). The length of the bonding trench 375b in the first direction may be greater than a length of the bonding pad 375a in the first direction. As shown in FIG. 9 (and FIGS. 10A-10D below), in each of the junction circuits 375-1, 375-2, 375-3, and 375-4, the length of the bonding trench 375b in the first direction may be greater than a length of the bonding via 375c in the first direction. In addition, the length of the bonding pad 375a in the first direction may be greater than the length of the bonding via 375a in the first direction. A width of the bonding trench 375b in a second direction (e.g., y-direction) perpendicular to the first direction (e.g., x-direction) may be less than a width of the bonding pad 375a in the second direction and may be greater than a width of the bonding via 375c in the second direction. In addition, the width of the bonding pad 375a in the second direction may be greater than the width of the bonding via 375c in the second direction. The thickness in a third direction (e.g., z-direction) perpendicular to the first direction (e.g., x-direction) and the second direction (e.g., y-direction) of the bonding trench 375b may be substantially the same as the thickness of the bonding via 375c and bonding pad 375a.

Figure 10A:
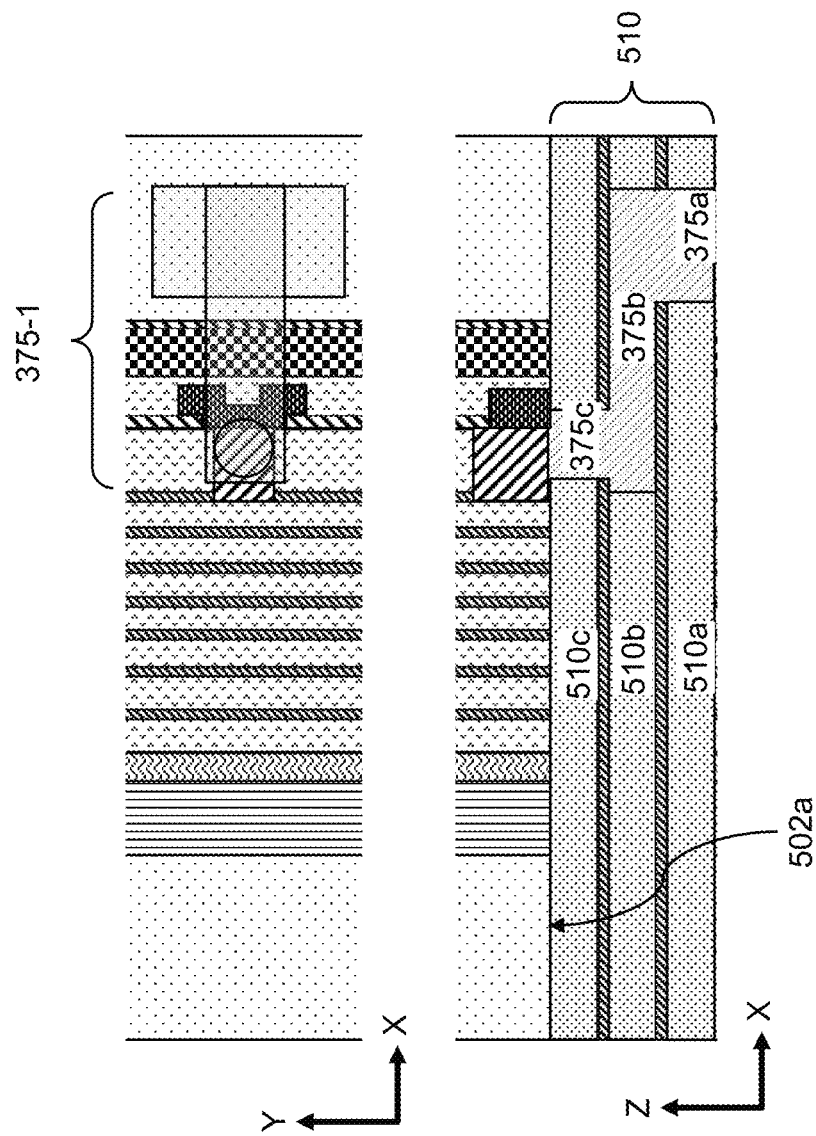
FIGS. 10A-10D illustrate a plan view (X and Y directions) and a vertical cross-sectional view (X and Z directions) for each of the example junction circuits (e.g., bonding layer metal routing), according to various embodiments.
Figure 10B:
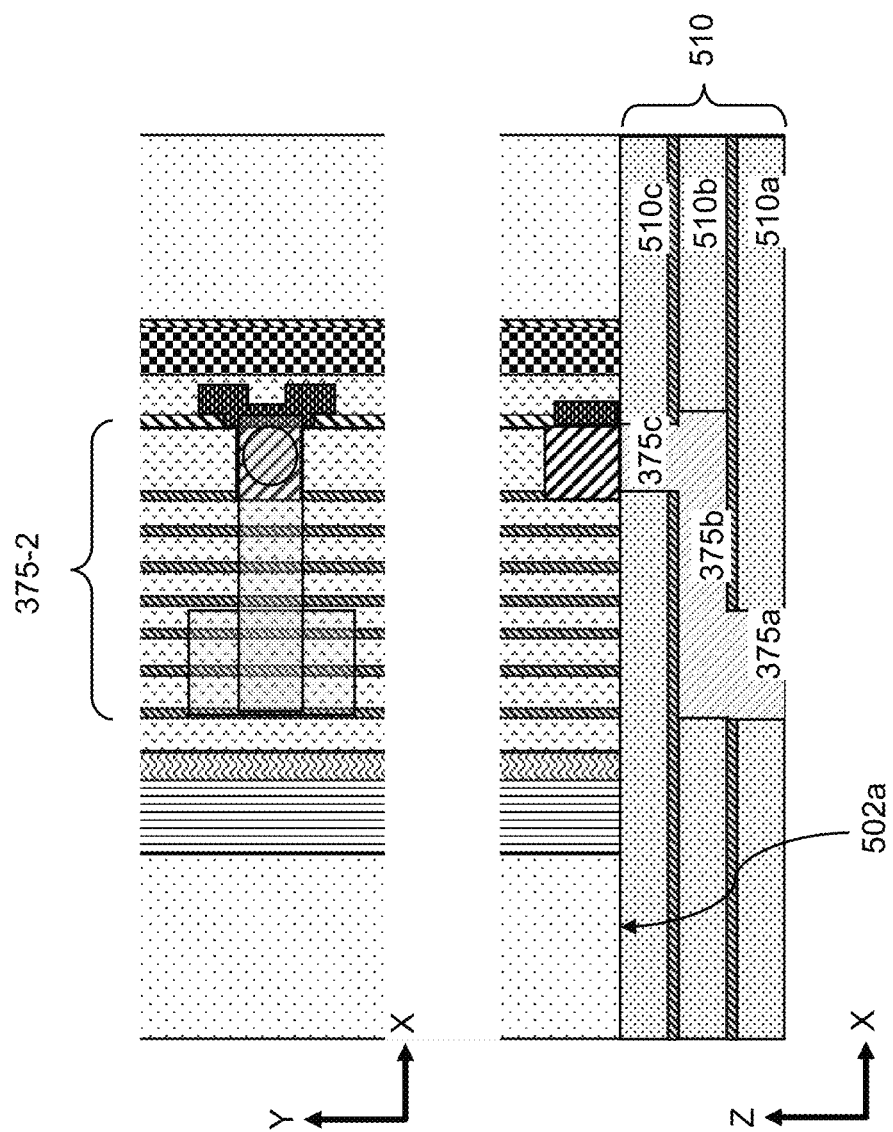
Figure 10C:
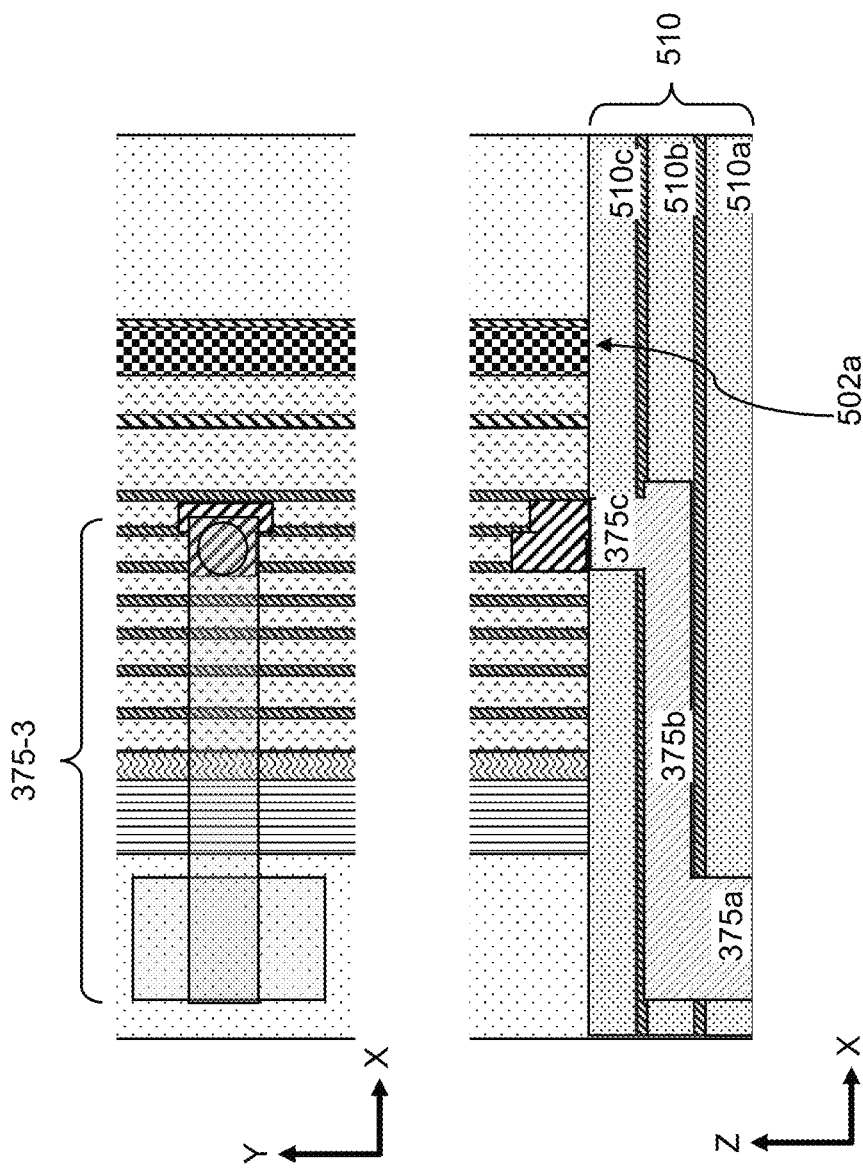
Figure 10D:
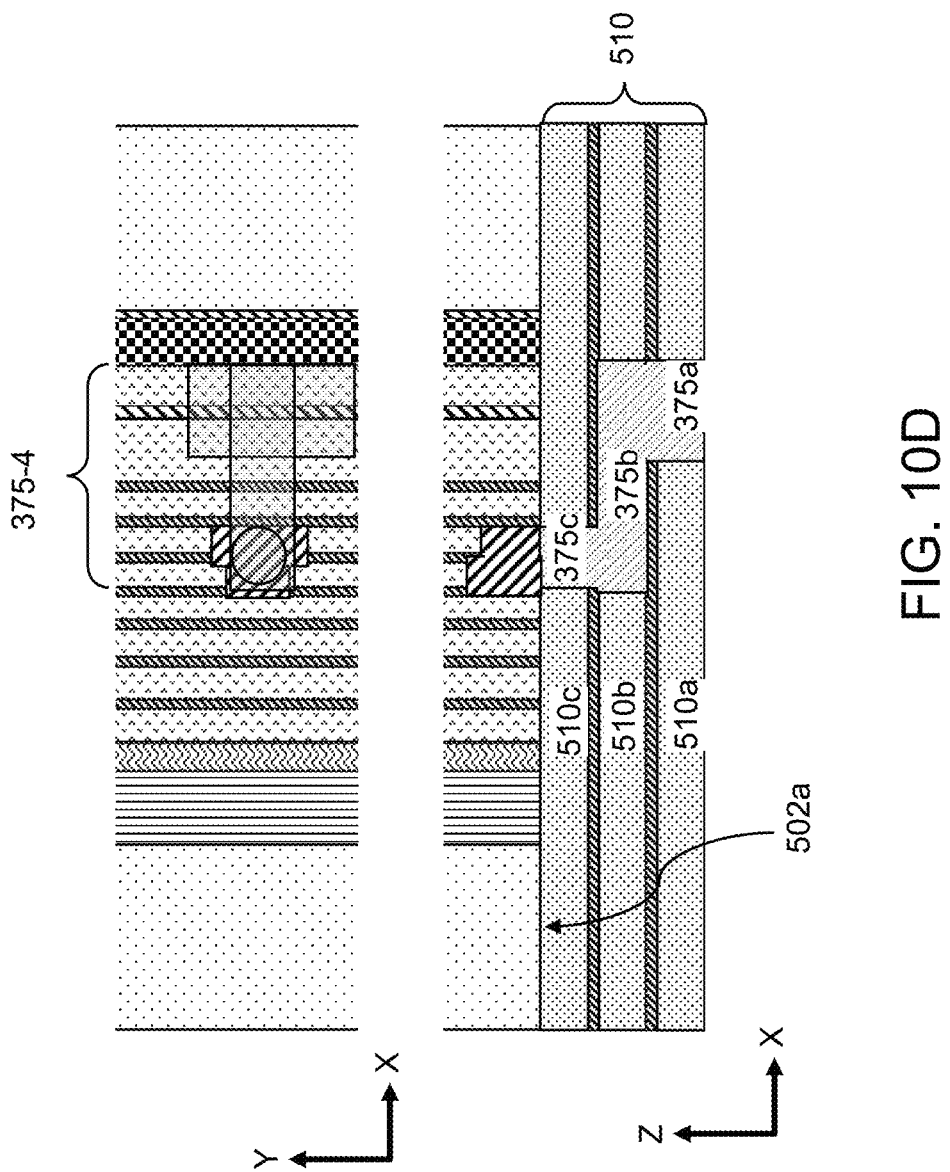

FIGS. 10A-10D illustrate semi-transparent plan views (X and Y directions) and corresponding vertical cross-sectional views (X and Z directions) for each of the example junction circuits 375-1 to 375-4 (e.g., bonding layer metal routing), according to various embodiments. In particular, the vertical cross-sectional view of FIG. 10A illustrates the bonding pad 375a, bonding trench 375b and bonding via 375c of junction circuit 375-1 formed in first bonding layer 510a, second bonding layer 510b and third bonding layer 510c, respectively, of bonding layer 510 (e.g., multi-layered bonding layer) that is formed on the second interface surface 502a. The vertical cross-sectional view of FIG. 10B illustrates the bonding pad 375a, bonding trench 375b and bonding via 375c of junction circuit 375-2 formed in first bonding layer 510a, second bonding layer 510b and third bonding layer 510c, respectively, of bonding layer 510 that is formed on the second interface surface 502a. The vertical cross-sectional view of FIG. 10C illustrates the bonding pad 375a, bonding trench 375b and bonding via 375c of junction circuit 375-3 formed in first bonding layer 510a, second bonding layer 510b and third bonding layer 510c, respectively, of bonding layer 510 that is formed on the second interface surface 502a. The vertical cross-sectional view of FIG. 10D illustrates the bonding pad 375a, bonding trench 375b and bonding via 375c of junction circuit 375-4 formed in first bonding layer 510a, second bonding layer 510b and third bonding layer 510c, respectively, of bonding layer 510 that is formed on the second interface surface 502a. With reference to FIGS. 10A-10D, the cross-sectional shape of the bonding via 375c in a first plane (e.g., x-y plane) may be substantially circular, whereas the cross-sectional shapes of the bonding trench 375b and bonding pad 375a may be substantially rectangular. However, additional cross-sectional shapes of the bonding pad 375a, bonding trench 375b and bonding via 375c are within the contemplated scope of disclosure.

Figure 11:
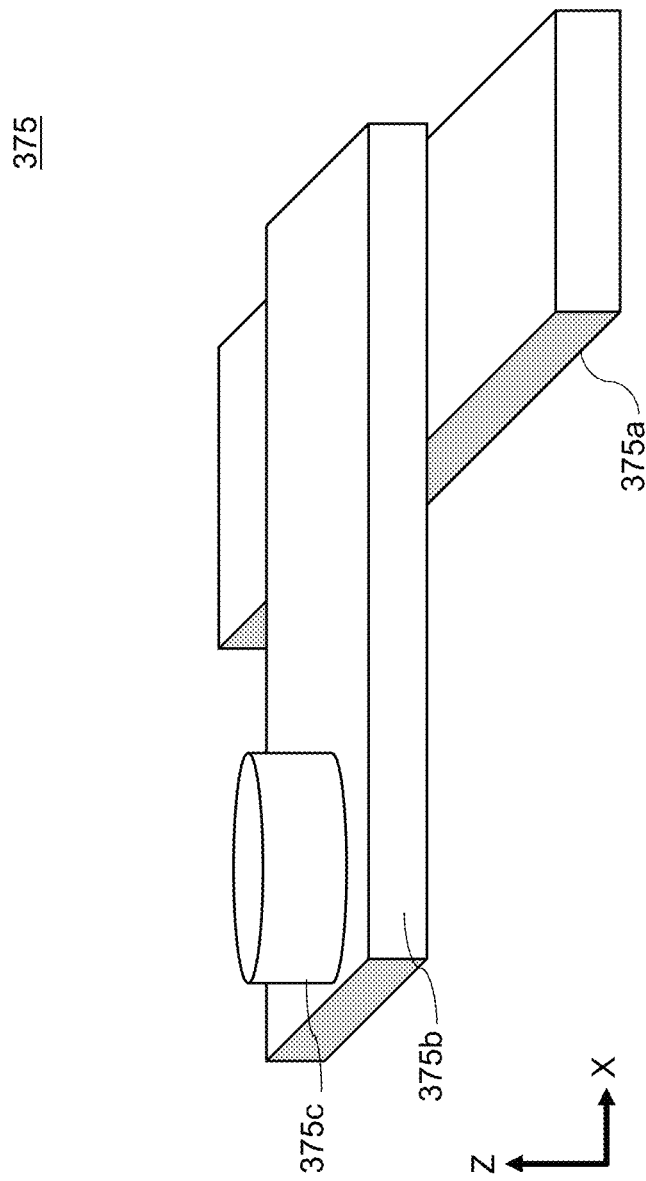
FIG. 11 provides a perspective view of a junction circuit (e.g., bonding layer metal routing), according to various embodiments.

FIG. 11 provides a perspective view of a junction circuit 375 (e.g., bonding layer metal routing), according to various embodiments. The configuration of junction circuit 375 in FIG. 11 is presented merely for illustrative purposes and is not intended to be limiting. A height (e.g., thickness in the Z direction) of the each of the bonding pad 375a, bonding trench 375b and bonding via 375c may be substantially equal to a height of the dielectric layer of the bonding layer in which the junction circuit 375 is formed.

Figure 12:
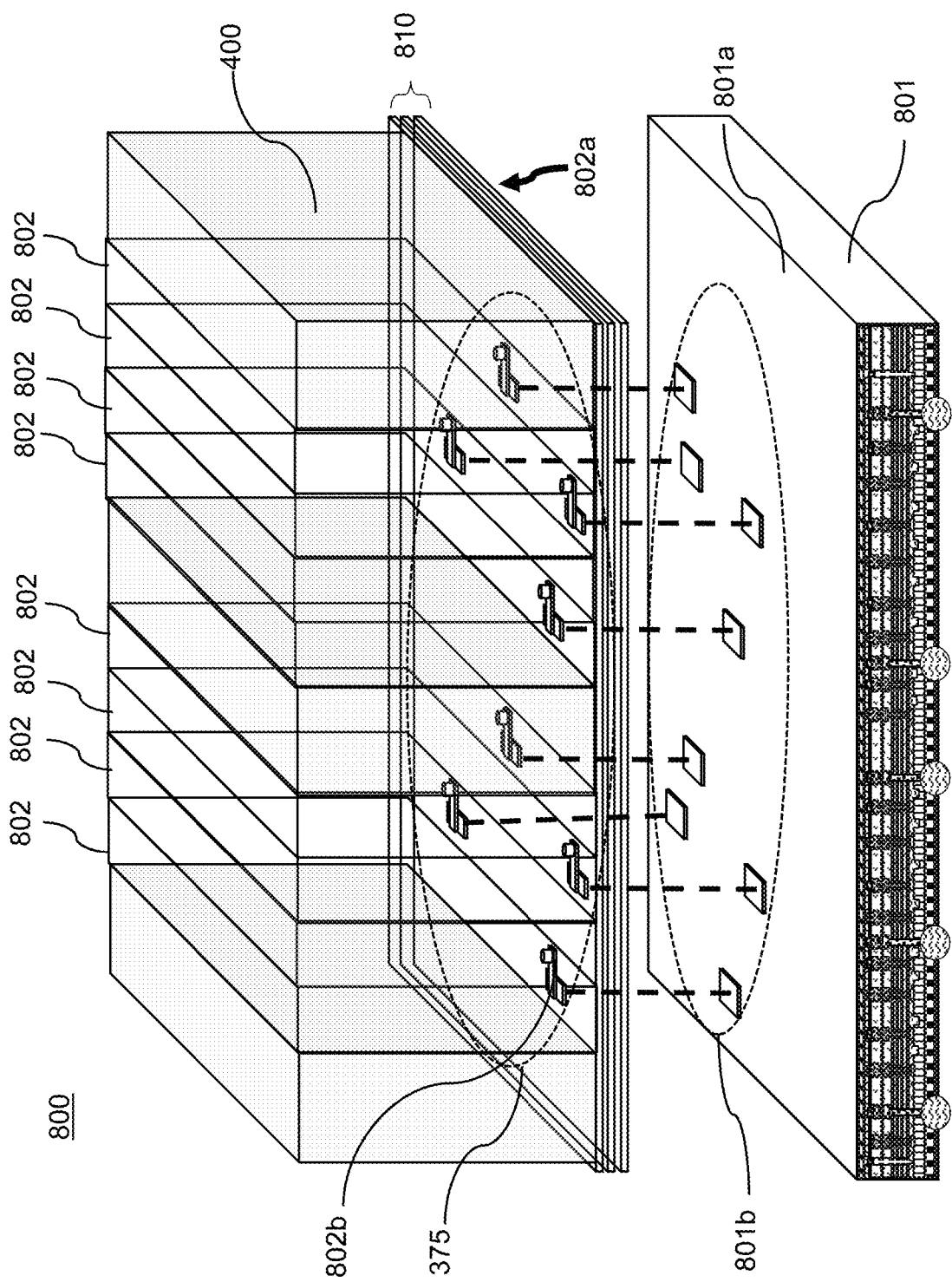
FIG. 12 provides an exploded view of a semiconductor device, according to various embodiments.

FIG. 12 provides an exploded view of a semiconductor device 800, according to various embodiments. As illustrated in FIG. 12, the semiconductor device 800 includes a plurality of first contacts 801b formed on a first interface surface 801a of a first semiconductor die 801, and a plurality of second semiconductor dies 802 formed in a stacked semiconductor die group 400. The semiconductor device 800 also includes a plurality of junction circuits 375 formed in a bonding layer 810 and connecting second contacts (not shown) in the plurality of second semiconductor dies 802 to the plurality of first contacts 801b.

It should be noted that although FIG. 7B may be described with reference to the semiconductor device 500, FIG. 7B may be equally applicable in the semiconductor device 200 and semiconductor device 800. Thus, for example, the second interface surface 202a and the second interface surface 802a may have the same configuration as second interface surface 502a described above in FIG. 7B. Further, although FIGS. 9-11 may be described at times with reference to the semiconductor device 500, FIGS. 9-11 may be equally applicable in the semiconductor device 200 and semiconductor device 800. Thus, for example, the configuration of the junction circuit 375 and the location of the junction circuit 375 relative to the second interface surface 202a and 802a in the semiconductor device 200 and the semiconductor device 800 may the same at that described above in FIGS. 9-11.

Figure 13:
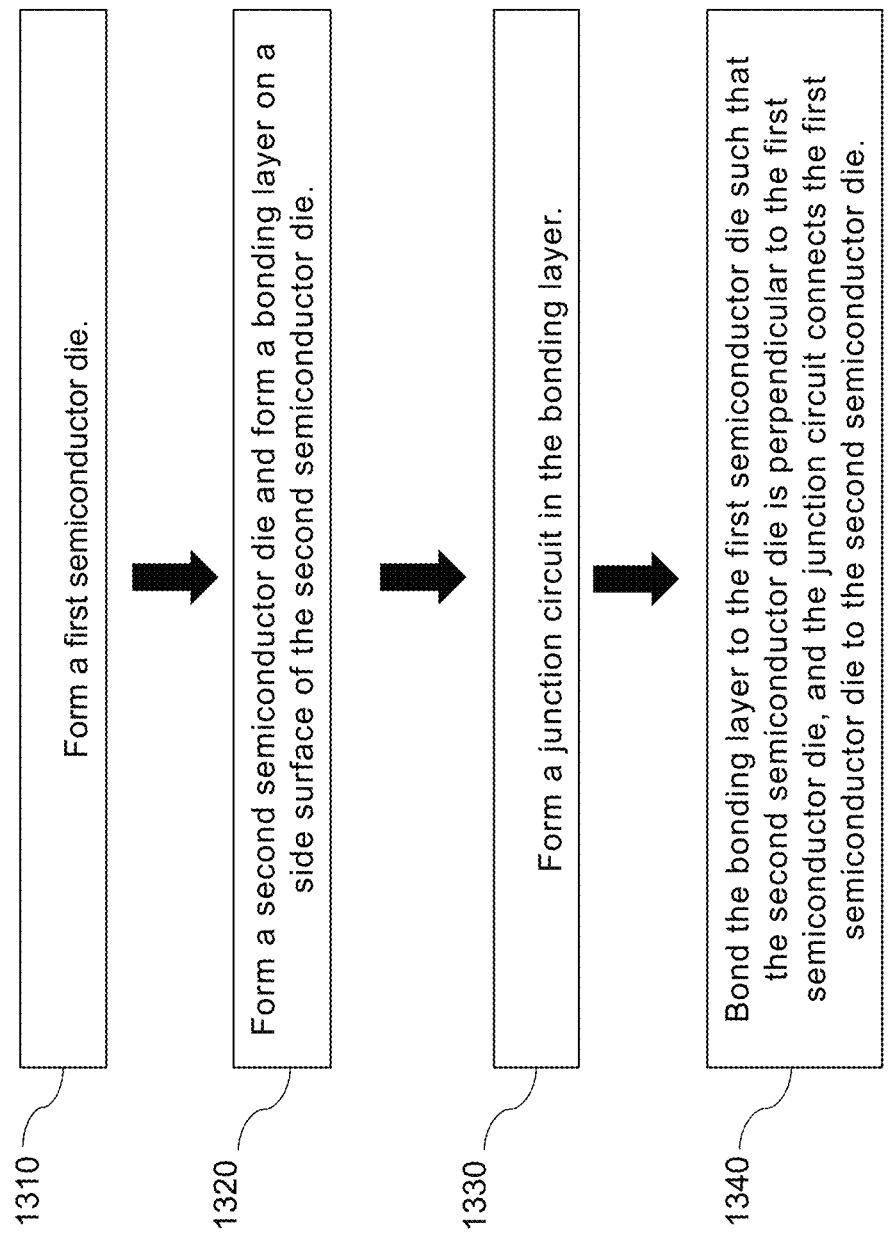
FIG. 13 provides a flowchart illustrating a method of making a semiconductor device according to various embodiments.

FIG. 13 provides a flowchart illustrating a method of making a semiconductor device 200, 500, 800 according to various embodiments. Step 1310 of the method includes forming a first semiconductor die 201, 501, 801. Step 1320 includes forming a second semiconductor die 202, 502, 802 and forming a bonding layer 210, 510, 810 on a side surface of the second semiconductor die 202, 502, 802. Step 1330 includes forming a junction circuit 275, 375 in the bonding layer 210, 510, 810. Step 1340 includes bonding the bonding layer 210, 510, 810 to the first semiconductor die 201, 501, 801 such that the second semiconductor die 202, 502, 802 is perpendicular to the first semiconductor die 201, 501, 801, and the junction circuit 275, 375 connects the first semiconductor die 201, 501, 801 to the second semiconductor die 202, 502, 802.

Figure 14A:
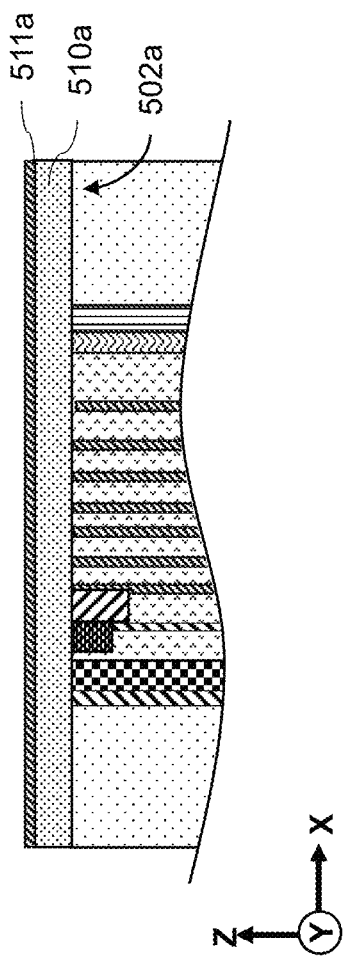
FIGS. 14A-14I illustrate various operations that may be included in an embodiment method of forming a junction circuit.

FIGS. 14A-14I illustrate various operations and intermediate structures that may be formed in a method of forming a junction circuit 275, 375 according to various embodiments. FIG. 14A illustrates an intermediate structure in which the first bonding layer 510a may be formed on the second interface surface 502a. The first bonding layer 510a may include, for example, silicon oxide or binding polymers, such as an epoxy, a polyimide (PI), a benzocyclobutene (BCB), and a polybenzoxazole (PBO). Other suitable bonding layer materials may be within the contemplated scope of disclosure. The first bonding layer 510a may be formed, for example, by chemical vapor deposition (CVD), plasma-enhanced CVD (PECVD), low pressure chemical vapor deposition (LPCVD), physical vapor deposition (PVD) or atomic layer deposition (ALD).

An optional first etch stop layer 511a may be formed on the first bonding layer 510a. The first etch stop layer 511a may include, for example, SiC, SiN, etc. Other suitable etch stop materials may be within the contemplated scope of disclosure. The first etch stop layer 511a may also be formed, for example, by chemical vapor deposition (CVD), plasma-enhanced CVD (PECVD), low pressure chemical vapor deposition (LPCVD), physical vapor deposition (PVD) or atomic layer deposition (ALD).

Figure 14B:
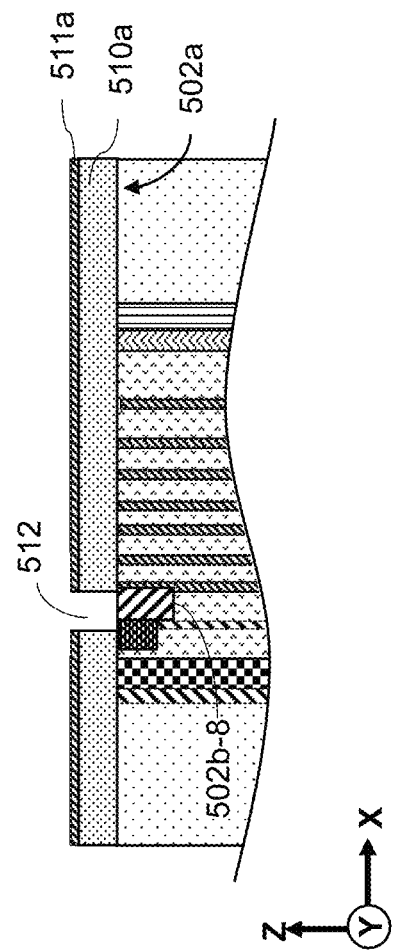

FIG. 14B illustrates an intermediate structure including a first hole 512 formed in the first bonding layer 510a and the first etch stop layer 511a, according to various embodiments. The first hole 512 may be formed over the combination aluminum pad/copper trench 502b-8 (e.g., second contact 502b) in the second interface surface 502a. Although this example may include the combination aluminum pad/copper trench 502b-8, any second contact (e.g., any of second contacts 502b-1 through 502b-9 in FIG. 7B) may be used in the method of FIGS. 14A-14I.

The first hole 512 may have, for example, a circular cross-section in the z-direction, and the circular cross-section may have a diameter which is less than a size (e.g., length in the x-direction and length in the y-direction) of the combination aluminum pad/copper trench 502b-8. Thus, the first hole 512 may be entirely within the outer perimeter of the surface of the combination aluminum pad/copper trench 502b-8 in a plan view. That is, an area of the surface of the combination aluminum pad/copper trench 502b-8 in a plan view may be greater than an area of the cross-section of the first hole 512 (e.g., see junction circuit 375-1 in FIG. 9).

The first hole 512 may be formed, for example, by using a photolithographic process. The photolithographic process may include forming a patterned photoresist mask (not shown) on the first etch stop layer 511a, and etching (e.g., wet etching, dry etching, etc.) the exposed first etch stop layer 511a and the first bonding layer 510a through an opening in the photoresist mask so as to expose the surface of the combination aluminum pad/copper trench 502b-8. The photoresist mask may be subsequently removed by ashing, dissolving the photoresist mask or by consuming the photoresist mask during the etch process.

Figure 14C:
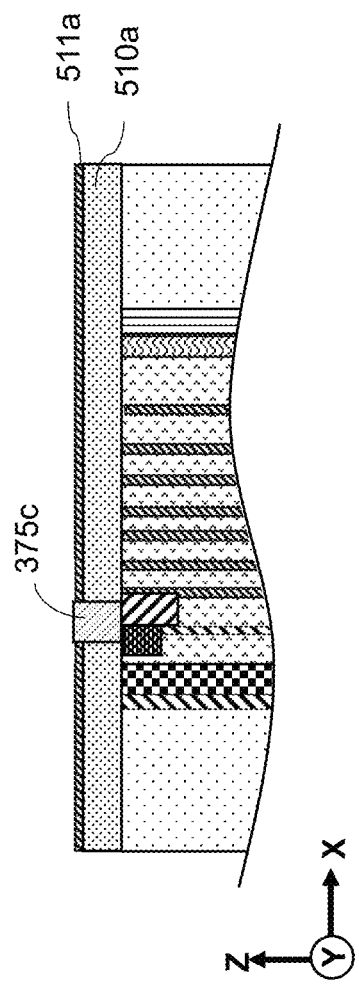

FIG. 14C illustrates an intermediate structure including the bonding via 375c formed in the first hole 512, according to various embodiments. The bonding via 375c may include a metal material that may include, for example, tungsten (W), copper (Cu), a copper alloy, aluminum (Al), an aluminum alloy, or a combination thereof, or the like. Other suitable conductive metal materials for use as the bonding via 375c are within the contemplated scope of disclosure. The bonding via 375c may be formed, for example, by forming metal material on the first etch stop layer 511a so that it fills the first hole 512. The metal material may be formed in the first hole 512 through a deposition process or may be grown in the first hole 512. The metal material may be deposited, for example, by chemical vapor deposition (CVD), plasma-enhanced CVD (PECVD), low pressure chemical vapor deposition (LPCVD), physical vapor deposition (PVD) or atomic layer deposition (ALD). A planarization step such as chemical mechanical polishing (CMP) may then be performed so as to remove the metal material from a surface of the first etch stop layer 511a and so as to make a surface of the bonding via 375c substantially coplanar with the surface of the first etch stop layer 511a.

Figure 14D:
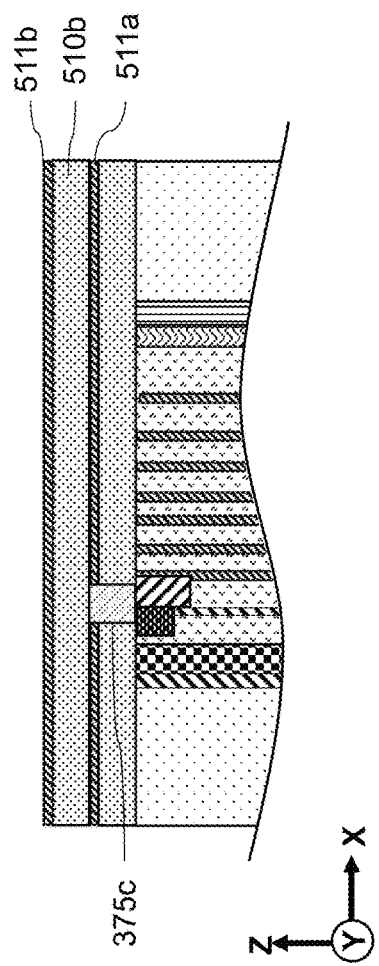

FIG. 14D illustrates an intermediate structure in which the second bonding layer 510b has been formed on the first etch stop layer 511a (or on the first bonding layer 510a if the first etch stop layer 511a is not present). The second bonding layer 510b may include, for example, silicon oxide or binding polymers, such as an epoxy, a polyimide (PI), a benzocyclobutene (BCB), and a polybenzoxazole (PBO). Other suitable bonding layer materials may be within the contemplated scope of disclosure. The second bonding layer 510b may be formed, for example, by chemical vapor deposition (CVD), plasma-enhanced CVD (PECVD), low pressure chemical vapor deposition (LPCVD), physical vapor deposition (PVD) or atomic layer deposition (ALD).

An optional second etch stop layer 511b may be formed on the second bonding layer 510b. The second etch stop layer 511b may include, for example, SiC, SiN, etc. Other suitable etch stop materials may be within the contemplated scope of disclosure. The second etch stop layer 511b may also be formed, for example, by chemical vapor deposition (CVD), plasma-enhanced CVD (PECVD), low pressure chemical vapor deposition (LPCVD), physical vapor deposition (PVD) or atomic layer deposition (ALD).

Figure 14E:
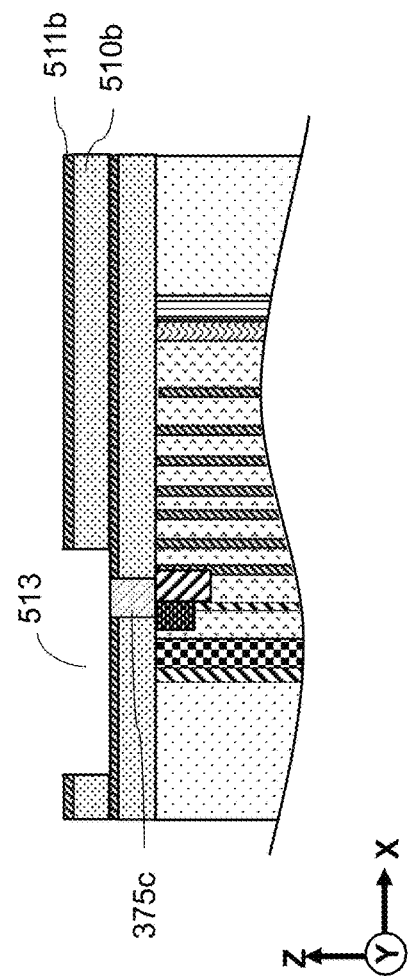

FIG. 14E illustrates an intermediate structure including a second hole 513 formed in the second bonding layer 510b and the second etch stop layer 511b, according to various embodiments. The second hole 513 may be formed over the bonding via 375c and may have, for example, a rectangular cross-section in the z-direction, and the rectangular cross-section may have a width in the y-direction and a length in the x-direction that may each be greater than a diameter of the bonding via 375c. Thus, the surface of the contact via 375c may be entirely within the outer perimeter of the surface of the second hole 513 in a plan view (e.g., see junction circuit 375-1 in FIG. 9).

The second hole 513 may be formed, for example, by using a photolithographic process. The photolithographic process may include forming a patterned photoresist mask (not shown) on the second etch stop layer 511b, and etching (e.g., wet etching, dry etching, etc.) the exposed second etch stop layer 511b and the second bonding layer 510b through an opening in the photoresist mask so as to expose the surface of the bonding via 375c. The photoresist mask may be subsequently removed by ashing, dissolving the photoresist mask or by consuming the photoresist mask during the etch process.

Figure 14F:
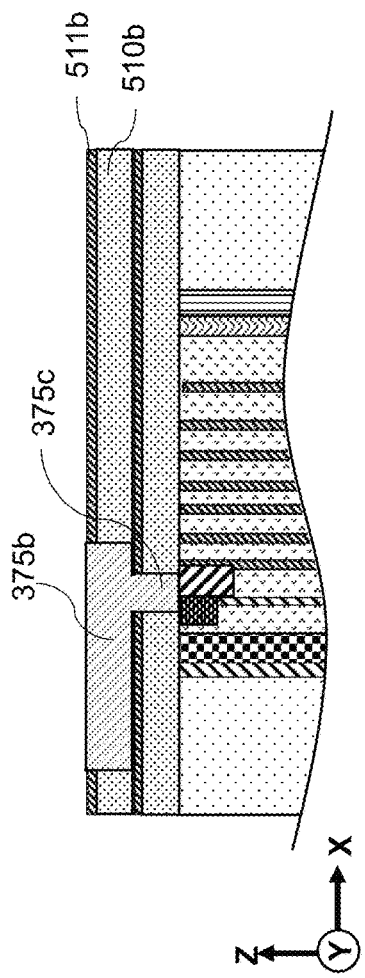

FIG. 14F illustrates an intermediate structure including the bonding trench 375b formed in the second hole 513, according to various embodiments. The bonding trench 375b may include a metal material that may include, for example, tungsten (W), copper (Cu), a copper alloy, aluminum (Al), an aluminum alloy, or a combination thereof, or the like. Other suitable conductive metal materials for use as the bonding trench 375b are within the contemplated scope of disclosure. The bonding trench 375b may be formed, for example, by depositing the metal material on the second etch stop layer 511b so that it fills the second hole 513. The metal material may be deposited, for example, by chemical vapor deposition (CVD), plasma-enhanced CVD (PECVD), low pressure chemical vapor deposition (LPCVD), physical vapor deposition (PVD) or atomic layer deposition (ALD). A planarization step such as chemical mechanical polishing (CMP) may then be performed so as to remove the metal material from a surface of the second etch stop layer 511b and so as to make a surface of the bonding trench 375b substantially coplanar with the surface of the second etch stop layer 511b.

Figure 14G:
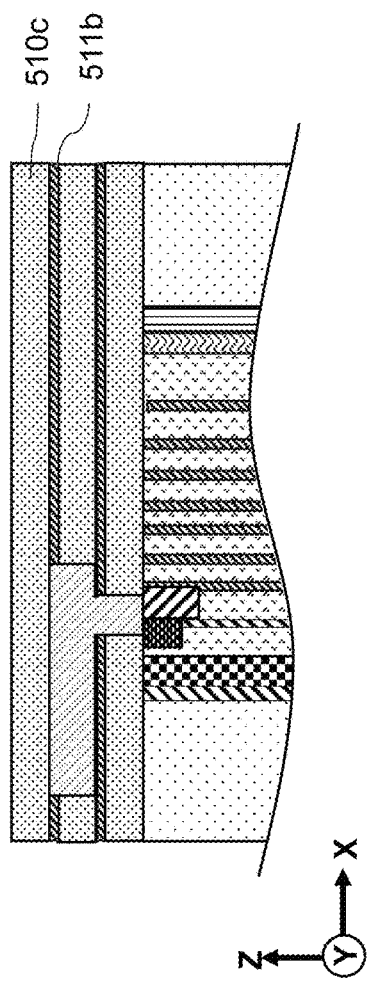

FIG. 14G illustrates an intermediate structure in which the third bonding layer 510c has been formed on the second etch stop layer 511b (or on the second bonding layer 510b if the second etch stop layer 511b is not present). The third bonding layer 510c may include, for example, silicon oxide or binding polymers, such as an epoxy, a polyimide (PI), a benzocyclobutene (BCB), and a polybenzoxazole (PBO). Other suitable bonding layer materials may be within the contemplated scope of disclosure. The third bonding layer 510c may be formed, for example, by chemical vapor deposition (CVD), plasma-enhanced CVD (PECVD), low pressure chemical vapor deposition (LPCVD), physical vapor deposition (PVD) or atomic layer deposition (ALD). The upper surface of the third bonding layer 510c may serve as an interface for bonding with the first semiconductor die 501 (e.g., see FIG. 7D).

Figure 14H:
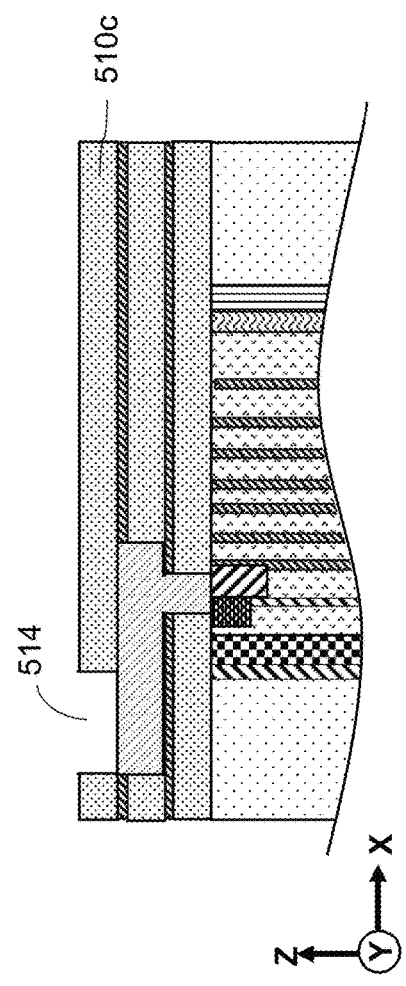

FIG. 14H illustrates an intermediate structure including a third hole 514 formed in the third bonding layer 510c according to various embodiments. The third hole 514 may be formed over the bonding trench 375b and may have, for example, a rectangular cross-section in the z-direction. The rectangular cross-section may have a width in the y-direction greater than the width of the bonding trench 375b, and a length in the x-direction that is less than the length of the bonding trench 375b (e.g., see junction circuit 375-1 in FIG. 9).

The third hole 514 may be formed, for example, by using a photolithographic process. The photolithographic process may include forming a patterned photoresist mask (not shown) on the third bonding layer 510c, and etching (e.g., wet etching, dry etching, etc.) the exposed third bonding layer 510c through an opening in the photoresist mask so as to expose the surface of the bonding trench 375b. The photoresist mask may be subsequently removed by ashing, dissolving the photoresist mask or by consuming the photoresist mask during the etch process.

Figure 14I:
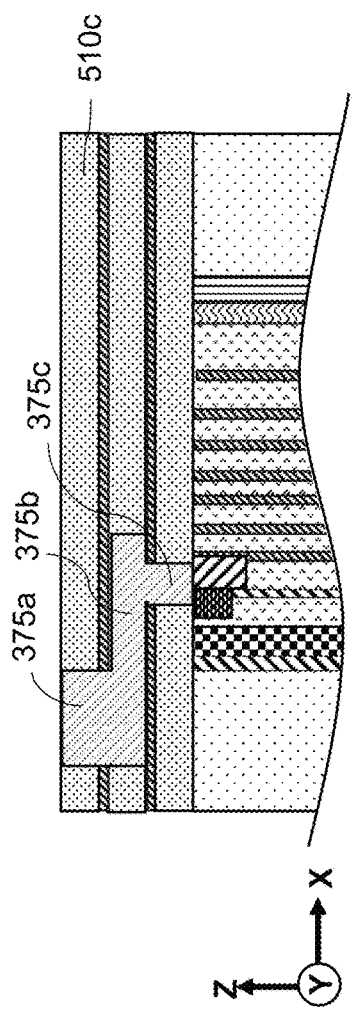

FIG. 14I illustrates an intermediate structure including the bonding pad 375a formed in the third hole 514, according to various embodiments. The bonding pad 375a may include a metal material that may include, for example, tungsten (W), copper (Cu), a copper alloy, aluminum (Al), an aluminum alloy, or a combination thereof, or the like. Other suitable conductive metal materials for use as the bonding pad 375a are within the contemplated scope of disclosure. The bonding pad 375a may be formed, for example, by depositing the metal material on the third bonding layer 510c so that it fills the third hole 514. The metal material may be deposited, for example, by chemical vapor deposition (CVD), plasma-enhanced CVD (PECVD), low pressure chemical vapor deposition (LPCVD), physical vapor deposition (PVD) or atomic layer deposition (ALD). A planarization step such as chemical mechanical polishing (CMP) may then be performed so as to remove the metal material from the upper surface of the third bonding layer 510c so as to make a surface of the bonding pad 375a substantially coplanar with the surface of the third bonding layer 510c.

After the forming of the junction circuit 275, 375, the bonding layer 510 including the first bonding layer 510a, second bonding layer 510b and third bonding layer 510c, and the junction circuit 375 may then be bonded to the second interface surface 502a by using a hybrid bonding process. As such, the junction circuit 375 may be fused to the combination aluminum pad/copper trench 502b-8 (e.g., second contact 502b) in the second interface surface 502a, and the bonding layer 510 may be bonded to the dielectric encapsulation layer 460 and to underlying dielectric layers of the second semiconductor die 502.

Figure 15:
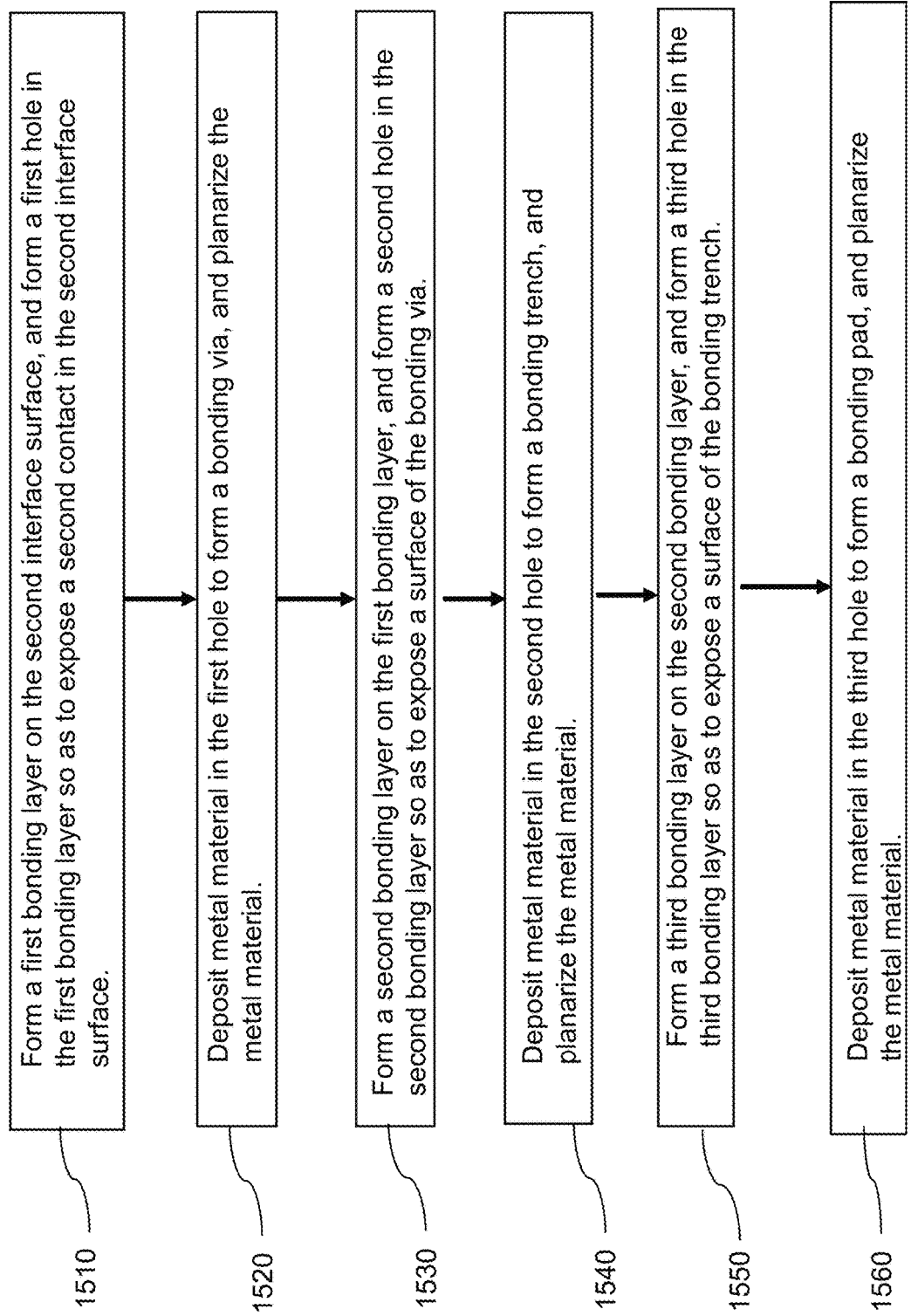
FIG. 15 is a flowchart illustrating a method of forming a junction circuit according to various embodiments.

FIG. 15 is a flowchart illustrating a method of forming a junction circuit 275, 375 according to various embodiments. The method includes Step 1510 of forming a first bonding layer on the second interface surface, and forming a first hole in the first bonding layer so as to expose a second contact in the second interface surface, Step 1520 of depositing metal material in the first hole to form a bonding via, and planarizing the metal material, Step 1530 of forming a second bonding layer on the first bonding layer, and forming a second hole in the second bonding layer so as to expose a surface of the bonding via, Step 1540 of depositing metal material in the second hole to form a bonding trench, and planarizing the metal material, Step 1550 of forming a third bonding layer on the second bonding layer, and forming a third hole in the third bonding layer so as to expose a surface of the bonding trench, and Step 1560 of depositing metal material in the third hole to form a bonding pad, and planarizing the metal material.

Referring to FIGS. 1-15, in various embodiments, a semiconductor device 200, 500, 800 is provided, where the semiconductor device 200, 500, 800 may include a first semiconductor die 201, 501, 801, a second semiconductor die 202, 502, 802 including a side surface bonded to the first semiconductor die 201, 501, 801, such that the second semiconductor die 202, 502, 802 may be perpendicular to the first semiconductor die 201, 501, 801, and a junction circuit 275, 375 for connecting the first semiconductor die 201, 501, 801 to the second semiconductor die 202, 502, 802.

In one embodiment, the first semiconductor die 201, 501, 801 may include a first interface surface 201a, 501a, 801a including a first contact 201b, 501b, 801b, the second semiconductor die 202, 502, 802 may include a second interface surface 202a, 502a, 802a formed in the side surface and including a second contact 202b, 502b, 802b, and the junction circuit 275, 375 may include a metal layer connecting the first contact 201b, 501b, 801b to the second contact 202b, 502b, 802b. In one embodiment, the second contact 202b, 502b, 802b may include at least one of a metal contact, a metal bonding pad, a metal trench, a metal barrier layer and a metal via. In one embodiment, the semiconductor device 200, 500, 800 may further include a bonding layer 210, 510, 810 for bonding the second semiconductor die 202, 502, 802 to the first semiconductor die 201, 501, 801, the junction circuit 275, 375 being formed in the bonding layer 210, 510, 810. In one embodiment, the junction circuit 275, 375 may include a bonding redistribution layer (RDL) circuit that may be formed in the bonding layer 210, 510, 810. In one embodiment, the junction circuit 275, 375 may include a bonding pad 275a, 375a that contacts the first contact 201b, 501b, 801b in the first interface surface 201a, 501a, 801a of the first semiconductor die 201, 501, 801.

With reference to FIGS. 1-15, a semiconductor device 200, 500, 800 may be provided, where the semiconductor device 200, 500, 800 may include a first semiconductor die 201, 501, 801, a plurality of semiconductor die groups 350a, 350b that may be stacked together and include a side surface bonded to the first semiconductor die 201, 501, 801 such that the plurality of semiconductor die groups 350a, 350b are perpendicular to the first semiconductor die 201, 501, 801, each of the plurality of semiconductor die groups 350a, 350b including a plurality of semiconductor dies 300a-300d that are stacked together, a bonding structure 310 for bonding the plurality of semiconductor dies 300a-300d together, and a conductive via 150b, 150c, 150d formed in the bonding structure 310 for electrically coupling the plurality of semiconductor dies 300a-300d, and a junction circuit 275, 375 for connecting the first semiconductor die 201, 501, 801 to a second semiconductor die 202, 502, 802 in the plurality of semiconductor dies 300a-300d.

In one embodiment, the first semiconductor die 201, 501, 801 may include a first interface surface 201a, 501a, 801a including a first contact 201b, 501b, 801b, the second semiconductor die 202, 502, 802 may include a second interface surface 202a, 502a, 802a formed in the side surface of the plurality of semiconductor die groups 350a, 350b and including a second contact 202b, 502b, 802b, and the junction circuit 275, 375 may include a metal layer connecting the first contact 201b, 501b, 801b to the second contact 202b, 502b, 802b. In one embodiment, the second contact 202b, 502b, 802b may include at least one of a metal contact, a metal bonding pad, a metal trench, a metal barrier layer and a metal via. In one embodiment, the semiconductor device 200, 500, 800 may include a bonding layer 210, 510, 810 for bonding the plurality of semiconductor die groups 350a, 350b to the first semiconductor die 201, 501, 801, the junction circuit 275, 375 being formed in the bonding layer 210, 510, 810. In one embodiment, the junction circuit 275, 375 may include a bonding redistribution layer (RDL) circuit that may be formed in bonding layer 210, 510, 810. In one embodiment, the junction circuit 275, 375 may include a bonding pad 275a, 375a for contacting the first contact 201b, 501b, 801b in the first interface surface 201a, 501a, 801a of the first semiconductor die 201, 501, 801. In one embodiment, the bonding pad 275a, 375a may be formed in a metal-free area of the second interface surface 202a, 502a, 802a of the second semiconductor die 202, 502, 802. In one embodiment, the junction circuit further may include a bonding via 375c for contacting the second contact 202b, 502b, 802b and a bonding trench 375b for connecting the bonding via 375c to the bonding pad 275a, 375a. In one embodiment, the bonding layer 210, 510, 810 may include a plurality of layers and the bonding via 375c, bonding trench 375b and bonding pad 275a, 375a may be formed in separate layers of the plurality of layers.

With reference to FIGS. 1-15, a junction circuit 275, 375 may be provided. The junction circuit 375 may include: a bonding trench 375b that includes a first surface and a second surface opposite the first surface, and a first end and a second end opposite the first end; a bonding pad 375a formed on the first surface of the bonding trench 375b and at the first end of the bonding trench 375b, wherein the bonding pad 375a is configured to electrically couple the junction circuit 375 with a second die 202, 502, 802; and a bonding via 375c formed on the second surface of the bonding trench 375b and at the second end of the bonding trench 375b, wherein the bonding via 375c is configured to electrically couple the junction circuit 375 with a first die 201, 501, 801.

In an embodiment, the bonding trench 375b may extend longitudinally in a first direction, and a length of the bonding trench 375b in the first direction is greater than a length of the bonding pad 375a in the first direction. In one embodiment, the length of the bonding trench 375b in the first direction is greater than a length of the bonding via 375c in the first direction. In an embodiment, the length of the bonding pad 375a in the first direction is greater than the length of the bonding via 375c in the first direction. In an embodiment, a width of the bonding trench 375b in a second direction perpendicular to the first direction is less than a width of the bonding pad 375a in the second direction. In an embodiment, the width of the bonding trench 375*b* in the second direction is greater than a width of the bonding via 375*c* in the second direction. In an embodiment, the width of the bonding pad 375*a* in the second direction is greater than the width of the bonding via 375*c* in the second direction. In an embodiment, a thickness of the bonding trench 375*b* in a third direction perpendicular to the first direction and the second direction is substantially the same as a thickness of the bonding pad 375*a* in the third direction. In an embodiment, the thickness of the bonding trench 375*b* in the third direction is substantially the same as a thickness of the bonding via 375*c* in the third direction. In an embodiment, the thickness of the bonding pad 375*a* in the third direction is substantially the same as the thickness of the bonding via 375*c* in the third direction. In an embodiment, the bonding via 375*c* may include a substantially circular cross-section in a first plane, and each of the bonding trench 375*b* and bonding pad 375*a* comprises a substantially rectangular cross-section in the first plane. In an embodiment, each of the bonding trench 375*b*, bonding pad 375*a* and bonding via 375*c* may include at least one of copper, a copper alloy, aluminum and an aluminum alloy. In an embodiment, the bonding trench 375*b*, bonding pad 375*a* and bonding via 375*c* may include metal wiring layers of a bonding redistribution layer (RDL) circuit.

With reference to FIGS. 1-15, a method of making a semiconductor device 200, 500, 800 may be provided in which the method may include the operations of: forming a first semiconductor die 201, 501, 801, forming a second semiconductor die 202, 502, 802 and forming a bonding layer 210, 510, 810 on a side surface of the second semiconductor die 202, 502, 802, forming a junction circuit 275, 375 in the bonding layer 210, 510, 810, bonding the bonding layer 210, 510, 810 to the first semiconductor die 201, 501, 801 such that the second semiconductor die 202, 502, 802 is perpendicular to the first semiconductor die 201, 501, 801, and the junction circuit 275, 375 connects the first semiconductor die 201, 501, 801 to the second semiconductor die 202, 502, 802. In one embodiment, the forming of the first semiconductor die 201, 501, 801 includes forming the first semiconductor die 201, 501, 801 to include a first interface surface 201*a*, 501*a*, 801*a* including a first contact 201*b*, 501*b*, 801*b*, the forming of the second semiconductor die 202, 502, 802 includes forming the second semiconductor die 202, 502, 802 to include a second interface surface 202*a*, 502*a*, 802*a* formed in the side surface and including a second contact 202*b*, 502*b*, 802*b*, and the forming of the junction circuit 275, 375 includes forming a metal layer connecting the first contact 201*b*, 501*b*, 801*b* to the second contact 202*b*, 502*b*, 802*b*. In one embodiment, the forming of the second semiconductor die 202, 502, 802 includes forming the second contact 202*b*, 502*b*, 802*b* to include at least one of a metal contact, a metal bonding pad, a metal trench, a metal barrier layer and a metal via. In one embodiment, the forming of the junction circuit 275, 375 includes forming a bonding redistribution layer (RDL) circuit in the bonding layer 210, 510, 810. In one embodiment, the forming of the junction circuit 275, 375 includes forming a bonding pad 275*a*, 375*a* that contacts the first contact 201*b*, 501*b*, 801*b* in the first interface surface 201*a*, 501*a*, 801*a* of the first semiconductor die 201, 501, 801.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first semiconductor die including a first contact;
   a second semiconductor die including a side surface bonded to the first semiconductor die such that the second semiconductor die is perpendicular to the first semiconductor die, wherein the side surface comprises:
      a dielectric layer comprising at least one of interlayer dielectric or intermetal dielectric; and
      a second contact in the dielectric layer; and
   a junction circuit contacting the first contact and the second contact and configured to connect the first semiconductor die to the second semiconductor die.

2. The semiconductor device of claim 1, wherein the first semiconductor die comprises a first interface surface including the first contact,
   wherein the second semiconductor die comprises a second interface surface formed in the side surface and including the second contact, and
   wherein the junction circuit comprises a metal layer connecting the first contact to the second contact.

3. The semiconductor device of claim 2, wherein the second contact comprises at least one of a metal contact, a metal bonding pad, a metal trench, a metal barrier layer and a metal via.

4. The semiconductor device of claim 2, further comprising:
   a bonding layer for bonding the second semiconductor die to the first semiconductor die, the junction circuit being formed in the bonding layer.

5. The semiconductor device of claim 4, wherein the junction circuit comprises a bonding redistribution layer (RDL) circuit that is formed in the bonding layer.

6. The semiconductor device of claim 4, wherein the junction circuit comprises a bonding pad that contacts the first contact in the first interface surface of the first semiconductor die.

7. A junction circuit comprising:
   a bonding trench comprising a first surface and a second surface opposite the first surface, and a first end and a second end opposite the first end;
   a bonding pad formed on the first surface of the bonding trench and at the first end of the bonding trench, wherein the bonding pad is configured to electrically couple the junction circuit with a first die; and
   a bonding via formed on the second surface of the bonding trench and at the second end of the bonding trench, wherein the bonding via is configured to electrically couple the junction circuit with a second die.

8. The junction circuit of claim 7, wherein the bonding trench extends longitudinally in a first direction, and a length of the bonding trench in the first direction is greater than a length of the bonding pad in the first direction.

9. The junction circuit of claim 8, wherein the length of the bonding trench in the first direction is greater than a length of the bonding via in the first direction.

10. The junction circuit of claim 9, wherein the length of the bonding pad in the first direction is greater than the length of the bonding via in the first direction.

11. The junction circuit of claim 8, wherein a width of the bonding trench in a second direction perpendicular to the first direction is less than a width of the bonding pad in the second direction.

12. The junction circuit of claim 11, wherein the width of the bonding trench in the second direction is greater than a width of the bonding via in the second direction.

13. The junction circuit of claim 12, wherein the width of the bonding pad in the second direction is greater than the width of the bonding via in the second direction.

14. The junction circuit of claim 10, wherein a thickness of the bonding trench in a third direction perpendicular to the first direction and the second direction is substantially the same as a thickness of the bonding pad in the third direction.

15. The junction circuit of claim 14, wherein the thickness of the bonding trench in the third direction is substantially the same as a thickness of the bonding via in the third direction.

16. The junction circuit of claim 15, wherein the thickness of the bonding pad in the third direction is substantially the same as the thickness of the bonding via in the third direction.

17. The junction circuit of claim 14, wherein the bonding via comprises a substantially circular cross-section in a first plane, and each of the bonding trench and bonding pad comprises a substantially rectangular cross-section in the first plane.

18. The junction circuit of claim 7, wherein each of the bonding trench, bonding pad and bonding via comprise at least one of copper, a copper alloy, aluminum and an aluminum alloy.

19. The junction circuit of claim 7, wherein the bonding trench, bonding pad and bonding via comprise metal wiring layers of a bonding redistribution layer (RDL) circuit.

20. A method of making a semiconductor device, comprising:

forming a first semiconductor die including a first contact;

forming a second semiconductor die and forming a bonding layer on a side surface of the second semiconductor die, wherein the side surface includes:

a dielectric layer comprising at least one of interlayer dielectric or intermetal dielectric; and a second contact in the dielectric layer;

forming a junction circuit in the bonding layer; and bonding the bonding layer to the first semiconductor die such that the second semiconductor die is perpendicular to the first semiconductor die, and the junction circuit contacts the second contact in the dielectric layer of the side surface and connects the first semiconductor die to the second semiconductor die.

* * * * *